United States Patent
Takahashi et al.

(10) Patent No.: US 8,055,391 B2
(45) Date of Patent: Nov. 8, 2011

(54) SERVER DEVICE AND PROGRAM

(75) Inventors: Masashi Takahashi, Hokkaido (JP); Minoru Obata, Yamanashi (JP); Noriaki Koyama, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 493 days.

(21) Appl. No.: 12/375,693

(22) PCT Filed: Jul. 9, 2007

(86) PCT No.: PCT/JP2007/063665
§ 371 (c)(1),
(2), (4) Date: Jan. 30, 2009

(87) PCT Pub. No.: WO2008/015880
PCT Pub. Date: Feb. 7, 2008

(65) Prior Publication Data
US 2009/0265027 A1    Oct. 22, 2009

(30) Foreign Application Priority Data
Aug. 1, 2006 (JP) ................................ 2006-209425

(51) Int. Cl.
G06F 11/00 (2006.01)
G06F 19/00 (2006.01)
G05B 11/01 (2006.01)
G05D 5/00 (2006.01)
H03M 13/00 (2006.01)
B29C 45/00 (2006.01)

(52) U.S. Cl. ............... 700/296; 714/2; 714/4.3; 714/10; 714/25; 714/47.1; 714/48; 714/50; 714/51; 714/759; 700/21; 700/108; 700/121; 700/131; 700/174; 700/202; 700/209

(58) Field of Classification Search ............... 714/2, 4.3, 714/10, 25, 47.1, 48, 50, 51, 759; 700/21, 700/51, 108, 121, 131, 174, 202–209, 296
See application file for complete search history.

(56) References Cited

U.S. PATENT DOCUMENTS
4,876,647 A * 10/1989 Gardner et al. ............... 700/284
(Continued)

FOREIGN PATENT DOCUMENTS
JP  07-297257 A  11/1995
(Continued)

OTHER PUBLICATIONS

Budge et al., "PARSEC Process Analysis with Recipe Support for Etcher Control", IEEE , 1999, 6 pg.*
(Continued)

*Primary Examiner* — Albert Decady
*Assistant Examiner* — Thomas Stevens
(74) *Attorney, Agent, or Firm* — Pearne & Gordon LLP

(57) ABSTRACT

A server device constituting a group management system includes one or more manufacturing apparatuses for performing a preset process on a target substrate, and the server device includes a measurement information storage unit for storing therein one or more measurement information; an instruction receiving unit for receiving an output instruction of the measurement information, which contains information specifying a predetermined start point and valid time information; a measurement information acquisition unit for acquiring, from the measurement information storage unit, measurement information ranging from the predetermined start point to a time point of the valid time; an output information composing unit for composing output information by using the acquired measurement information; and an output unit for outputting the output information composed by the output information composing unit.

21 Claims, 15 Drawing Sheets

| MANUFACTURING APPARATUS IDENTIFIER | RECIPE IDENTIFIER | RECIPE STEP IDENTIFIER | MEAN VALUE (GAS FLOW RATE) | TIME INFORMATION |
|---|---|---|---|---|
| E1 | R5 | 001 | 235 | 2005/12/02 15:00:00 |
| | | 001 | 239 | 2005/12/02 15:01:00 |
| | | 001 | 245 | 2005/12/02 15:02:00 |
| | | 001 | 251 | 2005/12/02 15:03:00 |
| | | ⋮ | ⋮ | ⋮ |
| | | 001 | 257 | 2005/12/02 16:18:00 |
| | | 001 | 256 | 2005/12/02 16:19:00 |
| | | 002 | 247 | 2005/12/02 16:20:00 |
| | | 002 | 240 | 2005/12/02 16:21:00 |
| | | ⋮ | ⋮ | ⋮ |
| E1 | R5 | 001 | 262 | 2005/12/03 14:00:00 |
| | | 001 | 260 | 2005/12/03 14:01:00 |
| | | ⋮ | ⋮ | ⋮ |
| E2 | R3 | 001 | 250 | 2005/12/04 10:00:30 |
| | | 001 | 238 | 2005/12/04 10:01:30 |
| ⋮ | ⋮ | ⋮ | ⋮ | ⋮ |

U.S. PATENT DOCUMENTS

| | | | |
|---|---|---|---|
| 5,525,808 A * | 6/1996 | Irie et al. | 250/548 |
| 6,727,106 B1 * | 4/2004 | Ankutse et al. | 438/5 |
| 6,909,933 B2 * | 6/2005 | Maeritz | 700/121 |
| 7,024,667 B2 * | 4/2006 | Orii | 717/149 |
| 7,266,726 B1 * | 9/2007 | Ladd et al. | 714/27 |
| 7,401,728 B2 * | 7/2008 | Markham et al. | 235/376 |
| 7,446,313 B2 * | 11/2008 | Maeda | 250/310 |
| 2002/0156549 A1 | 10/2002 | Hayashi | |
| 2003/0154421 A1 * | 8/2003 | Abe et al. | 714/2 |
| 2003/0155415 A1 * | 8/2003 | Markham et al. | 235/376 |
| 2005/0047645 A1 * | 3/2005 | Funk et al. | 382/145 |
| 2006/0191993 A1 * | 8/2006 | Markham et al. | 235/376 |
| 2007/0191980 A1 * | 8/2007 | Ho et al. | 700/110 |

FOREIGN PATENT DOCUMENTS

| | | |
|---|---|---|
| JP | 11-354395 A | 12/1999 |
| JP | 2002-025997 A | 1/2002 |
| JP | 2002-258931 A | 9/2002 |
| JP | 2004-165282 A | 6/2004 |
| JP | 2005-173911 A | 6/2005 |
| JP | 2006-093446 A | 4/2006 |

OTHER PUBLICATIONS

Edgar et al., "Automatic Control in Microelectronics Manufacturing: Practices, Challenges, and Possibilities", 2000, Automatica, vol. 36, Issue 11, 1567-1603 pages.*

International Search Report for PCT/JP2007/063665 dated Oct. 9, 2007, 3 pages.

Korean Office action for 10-2009-7002730 dated Nov. 11, 2010, 9 pages.

* cited by examiner

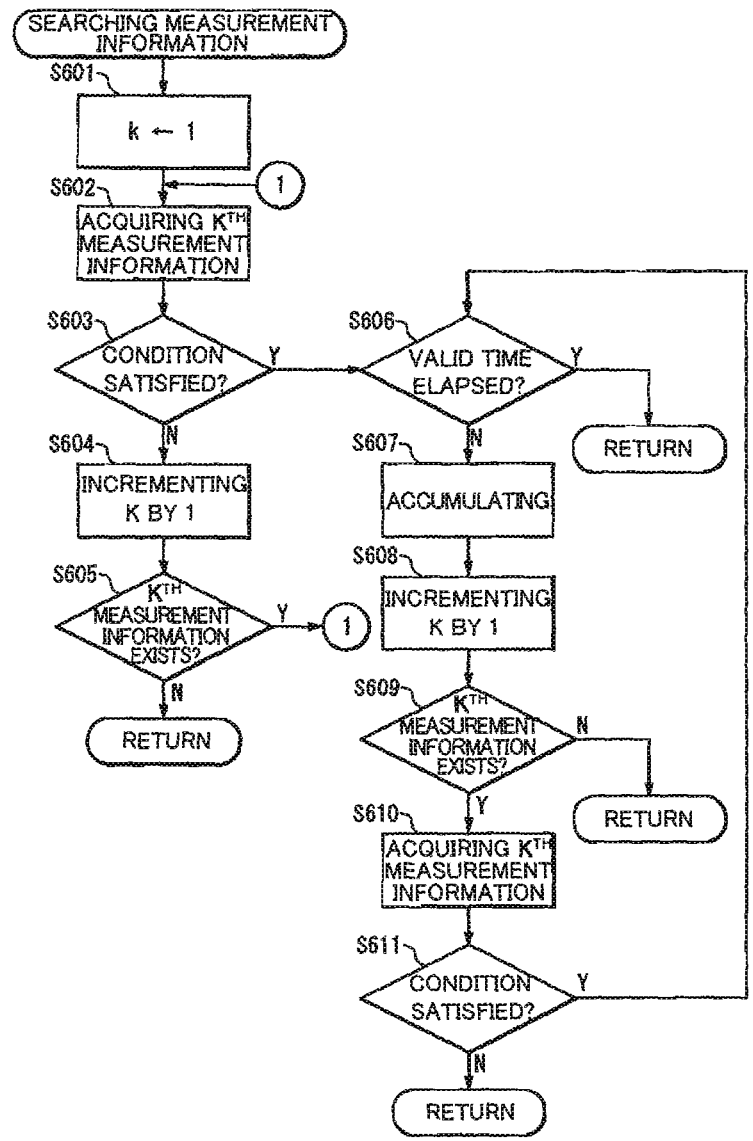

FIG. 8

| MANUFACTURING APPARATUS IDENTIFIER | RECIPE IDENTIFIER | RECIPE STEP IDENTIFIER | VALUE (GAS FLOW RATE) | TIME INFORMATION |
|---|---|---|---|---|
| E1 | R5 | 001 | 230 | 2005/12/02 15:00:00 |
| | | 001 | 232 | 2005/12/02 15:00:01 |
| | | 001 | 235 | 2005/12/02 15:00:02 |
| | | ... | ... | ... |
| | | 001 | 256 | 2005/12/02 16:19:59 |
| | | 002 | 248 | 2005/12/02 16:20:00 |
| | | 002 | 233 | 2005/12/02 16:20:01 |
| | | ... | ... | ... |
| E1 | R5 | 001 | 261 | 2005/12/03 14:00:00 |
| | | 001 | 261 | 2005/12/03 14:00:01 |
| E2 | R3 | 001 | 254 | 2005/12/04 10:00:30 |
| | | 001 | 241 | 2005/12/04 10:00:31 |
| .... | .... | ...... | ...... | ...... |

FIG. 9

| MANUFACTURING APPARATUS IDENTIFIER | RECIPE IDENTIFIER | RECIPE STEP IDENTIFIER | MEAN VALUE (GAS FLOW RATE) | TIME INFORMATION |
|---|---|---|---|---|
| E1 | R5 | 001 | 235 | 2005/12/02 15:00:00 |
| | | 001 | 239 | 2005/12/02 15:01:00 |
| | | 001 | 245 | 2005/12/02 15:02:00 |
| | | 001 | 251 | 2005/12/02 15:03:00 |
| | | ... | ... | ... |
| E1 | R5 | 001 | 257 | 2005/12/02 16:18:00 |
| | | 001 | 258 | 2005/12/02 16:19:00 |
| | | 002 | 247 | 2005/12/02 16:20:00 |
| | | 002 | 240 | 2005/12/02 16:21:00 |
| | | ... | ... | ... |
| E2 | R3 | 001 | 262 | 2005/12/03 14:00:00 |
| | | 001 | 260 | 2005/12/03 14:01:00 |
| | | ... | ... | ... |
| | | 001 | 250 | 2005/12/04 10:00:30 |
| | | 001 | 238 | 2005/12/04 10:01:30 |
| .... | .... | ........ | ........ | ........ |

FIG. 10

CHART OUTPUT

| RECIPE STEP IDENTIFIER : | 001 | —101 |
| VALID TIME (MINUTE) : | 20 | —102 |
| GAS FLOW RATE CONDITION : | — | FAULT |
| DATA TYPE | : | GAS FLOW RATE —103 |
| TOTAL CHART | : | ☐ —104 |
| MANUFACTURING APPARATUS NAME | : | E1 |
| RECIPE NAME | : | ☐ All
☐ E1
☑ R1
☐ R2
☐ R3 |

( CANCEL ) ( CHART OUTPUT )

FIG. 11

| MANUFACTURING APPARATUS IDENTIFIER | RECIPE IDENTIFIER | RECIPE STEP IDENTIFIER | MEAN VALUE (GAS FLOW RATE) | TIME INFORMATION |
|---|---|---|---|---|
| E1 | R5 | 001 | 235 | 2005/12/02 15:00:00 |
| | | 001 | 239 | 2005/12/02 15:01:00 |
| | | 001 | 245 | 2005/12/02 15:02:00 |
| | | 001 | 251 | 2005/12/02 15:03:00 |
| | | 001 | 255 | 2005/12/02 15:04:00 |
| | | 001 | 252 | 2005/12/02 15:05:00 |
| | | ... | ... | ... |
| | | 001 | 256 | 2005/12/02 15:17:00 |
| | | 001 | 258 | 2005/12/02 15:18:00 |
| | | 001 | 257 | 2005/12/02 15:19:00 |
| | | 001 | 258 | 2005/12/02 15:20:00 |

FIG. 14

| MANUFACTURING APPARATUS IDENTIFIER | RECIPE IDENTIFIER | RECIPE STEP IDENTIFIER | TOTAL MEAN VALUE (GAS FLOW RATE) | TIME INFORMATION |
|---|---|---|---|---|
| E1 | R5 | 001 | 970 | 2005/12/02 15:03:00 |
| | | 001 | 1225 | 2005/12/02 15:04:00 |
| | | 001 | 1477 | 2005/12/02 15:05:00 |
| | | : | : | : |
| | | 001 | 4841 | 2005/12/02 15:21:00 |
| | | 001 | 5099 | 2005/12/02 15:22:00 |
| | | 001 | 5354 | 2005/12/02 15:23:00 |

SERVER DEVICE AND PROGRAM

TECHNICAL FIELD

The present invention relates to a server device in a group management system including, for example, one or more manufacturing apparatuses for performing a preset process on a target substrate, and the server device connected with the one or more manufacturing apparatuses.

BACKGROUND ART

Conventionally, there has been known a measurement data processing method capable of automatically and correctly processing data transmitted from a measuring device in a group management system of semiconductor manufacturing apparatuses (see, for example, Patent Document 1). In this measurement data processing method, a measuring device communication unit of a group managing unit of the group management system receives various kinds of measurement data transmitted from the measuring device. This measurement data processing method includes the steps of registering formulas for processing the measurement data in advance; upon receiving the measurement data, storing the received measurement data in a measurement data receiving buffer; selecting, among the registered formulas, one formula suitable for processing the measurement data and having at least one same recipe name as a recipe name of the measurement data and storing the selected formula in a formula storing buffer; applying the measurement data to the selected formula and performing a calculation; and storing a calculation result in a processed data storing buffer.

Further, the conventional group management system of semiconductor manufacturing apparatuses has a function of displaying time sequential information (hereinafter, referred to as a chart) measured by the semiconductor manufacturing apparatuses.

Further, as a manufacturing apparatus composing the group management system, there is a so-called batch type vertical heat treatment apparatus (see, Patent Document 2 and Patent Document 3).

Typically, in the semiconductor manufacturing apparatus, a manufacturing process is performed according to information indicating a process condition or a process sequence including a manufacturing parameter, which is called a recipe, or the like. Each step composing a sequence of the recipe is called a recipe step or simply called a step. The fault of the semiconductor manufacturing apparatus can be determined, when the recipe step is changed, by whether or not a control is performed according to a parameter of the chanced recipe step. Therefore, it is possible to recognize the fault of the semiconductor manufacturing apparatus by acquiring all measurement data obtained from the measuring device and then monitoring them, within a time period for performing the recipe step.

Patent Document 1: Japanese Patent Laid-open Publication No. H11-354395 (for example, Page 1 and FIG. 1)
Patent Document 2: Japanese Patent Publication No. 3543996 (for example, Page 1 and FIG. 1)
Patent Document 3: Japanese Patent Laid-open Publication No. 2002-25997 (for example, Page 1 and FIG. 1)

DISCLOSURE OF THE INVENTION

Problems to be Solved by the Invention

However, conventionally, since a monitoring time for a target object to be monitored can not be set appropriately, there has been a problem of exceeding a desired monitoring time and over-monitoring the state of the semiconductor manufacturing apparatus.

For example, conventionally, it has been possible to monitor the measurement data by reading the measurement data upon every recipe step. However, in this case, even when monitoring data ranging from a start point of a specific recipe step to a predetermined time point thereof, all measurement data in that whole recipe step are obtained and analyzed, so that the amount of unnecessary data increases, thereby causing a spending of an unnecessary monitoring time.

Further, conventionally, by presetting measurement values for specifying a start time point or an end time point, it has been possible to start or end the measurement when a measurement value reaches each preset value. However, even in this case, it is impossible to monitor only data ranging from a time point when the measurement value reaches the preset value to a predetermined time point, so that unnecessary data are obtained and analyzed, thereby resulting in a spending of an unnecessary monitoring time.

Furthermore, when charting and outputting the measurement value under monitoring, if there are included the measurement values unnecessary for monitoring as described above, all data including unnecessary data for monitoring become charted. Therefore, the measurement values obtained during a desired monitoring time, e.g., until a predetermined time point, are displayed in a small size or difficult to be found in a chart. As a result, it becomes difficult for a user to fully monitor them with eyes.

Means for Solving the Problems

A server device of the present invention is a server device constituting a group management system, which includes one or more manufacturing apparatuses for performing a preset process on a target substrate and the server device connected with the one or more manufacturing apparatuses and has a function of performing a fault detection, the server device including: a measurement information storage unit for storing therein plural measurement information, which is time sequential information measured in the one or more manufacturing apparatuses and has a measurement value obtained by performing a predetermined process by the manufacturing apparatuses and time information indicating time; an instruction receiving unit for receiving an output instruction of the measurement information, which contains information specifying a predetermined start point and information on a valid time during which the measurement information is acquired; a measurement information acquisition unit for acquiring, from the measurement information storage unit, measurement information ranging from the predetermined start point to a time point indicated by the valid time information; an output information composing unit for composing output information by using the acquired measurement information; and an output unit for outputting the output information composed by the output information composing unit.

With this configuration, it is possible to designate a time period for outputting the measurement information in more detail than, e.g., designating by a recipe step. Therefore, it prevents monitoring unnecessary measurement information and thus it is possible to efficiently monitor the manufacturing apparatus. Further, by setting the valid time as well as each recipe step, the monitoring time can be set more accurately, so that it becomes possible to monitor a dynamic characteristic of the group management system more accurately.

Further, in the server device of the present invention, the output information composing unit composes a chart as the output information by using the acquired measurement information; and the output unit outputs the chart composed by the output information composing unit.

With this configuration, since the output information can be monitored by using the chart, it becomes easy to know a state of the manufacturing apparatus.

Furthermore, in the server device of the present invention, the predetermined start point is a start time point of a specific recipe step contained in a recipe, the measurement information has a recipe step identifier for identifying the recipe step, the output instruction includes the recipe step identifier and the valid time information, and the measurement information acquisition unit acquires measurement information which corresponds to the recipe step identifier contained in the output instruction and ranges from the start time point of the recipe step identified by the recipe step identifier to a time point indicated by the valid time information.

With this configuration, in the recipe step, it is possible to monitor the measurement information ranging from the start time point of the recipe step to a time point of the valid time. For example, in the manufacturing apparatus, it is possible to monitor a pressure value ranging from the start time point of the recipe step to the time point of the valid time.

Moreover, in the server device of the present invention, the measurement information acquisition unit acquires measurement information until an end time point of the valid time or an end time point of the recipe step identified by the recipe step identifier, whichever is earlier.

With this configuration, it is possible to designate the monitoring time in more detail than each recipe step.

Further, in the server device of the present invention, the predetermined start point is a time point satisfying a condition related to the measurement information, the output instruction includes the condition related to the measurement information and the valid time information, and the measurement information acquisition unit includes: a first measurement information acquisition unit for acquiring measurement information which initially satisfies the condition related to the measurement information; and a valid time measurement information acquisition unit for acquiring measurement information for the valid time after the first measurement information acquisition unit acquires initial measurement information.

With this configuration, it is possible to monitor the measurement information for the valid time after a time point satisfying the measurement information condition. For example, in the manufacturing apparatus, if there is a sequence of depressurizing, it is possible to monitor a pressure value for the valid time after a time point when the pressure value reaches a target pressure which is the measurement information condition.

Furthermore, in the server device of the present invention, the measurement information acquisition unit acquires measurement information until an end time point of the valid time or a time point from which the measurement information acquired by the valid time measurement information acquisition unit does not satisfy the condition related to the measurement information anymore, whichever is earlier.

With this configuration, it becomes possible to appropriately designate an end time point for acquiring the measurement information to be monitored, so that the manufacturing apparatus can be monitored efficiently.

Moreover, in the server device of the present invention, the predetermined start point is a time point satisfying a condition related to the measurement information in a specific recipe step contained in a recipe, the measurement information has a recipe step identifier for identifying the recipe step, the output instruction includes the recipe step identifier, the condition related to the measurement information and the valid time information, and the measurement information acquisition unit includes: a first measurement information acquisition unit for acquiring measurement information, which corresponds to the recipe step identifier contained in the output instruction and initially satisfies the condition related to the measurement information; and a valid time measurement information acquisition unit for acquiring measurement information ranging from a time point when the first measurement information acquisition unit acquires initial measurement information to a time point indicated by the valid time information.

With this configuration, in the recipe step, it is possible to monitor the measurement information for the time point of the valid time after a time point satisfying the measurement information condition.

Further, in the server device of the present invention, the valid time measurement information acquisition unit acquires measurement information until an end time point of the valid time, an end time point of the recipe step identified by the recipe step identifier, or a time point from which the acquired measurement information does not satisfy the condition of the measurement value anymore, whichever is the earliest.

With this configuration, in the recipe step, since the end time point for acquiring the measurement information to be monitored can be appropriately designated, the manufacturing apparatus can be monitored efficiently.

Furthermore, in the server device of the present invention, the output information composing unit performs a specific calculation by using the acquired measurement information, and composes the output information by using a result of the calculation.

With this configuration, since the measurement information can be processed as data suitable for the purpose and then outputted, it becomes easier to monitor the measurement information.

Moreover, in the server device of the present invention, the server device further includes: a condition information storage unit for storing therein condition information indicating a condition for determining whether the measurement information has a fault; and a fault detection unit for determining whether the measurement information acquired by the measurement information acquisition unit satisfies the condition information stored in the condition information storage unit, wherein the output information composing unit composes the output information by using a determination result of the fault detection unit.

With this configuration, it is possible to easily find out the occurrence of the fault of the manufacturing apparatus.

Further, in the server device of the present invention, the output information composing unit composes an SPC chart which is a chart plotting the acquired measurement information according to a time sequence indicated by the time information contained in the measurement information, and the output unit outputs the SPC chart composed by the output information composing unit.

With this configuration, it is possible to easily monitor the change in the process of time or the non-uniformity of the manufacturing apparatus.

Furthermore, in the server device of the present invention, the output information composing unit composes a correlation chart which is a chart showing a correlation between two kinds of measurement information from the acquired measurement information, and the output unit outputs the correlation chart composed by the output information composing unit.

With this configuration, a correlation between two variables can be monitored, so that it is possible to efficiently perform the fault detection.

Moreover, in the server device of the present invention, the output information composing unit composes a MD chart which is a chart showing a correlation among three or more kinds of measurement information from the acquired measurement information, and the output unit outputs the MD chart composed by the output information composing unit.

With this configuration, a correlation among the multi-variables can be monitored, so that it is possible to detect the fault more efficiently.

Effect of the Invention

In accordance with a server device of the present invention, it is possible to appropriately designate a time period for outputting measurement information.

BRIEF DESCRIPTION OF THE DRAWINGS

FIG. 6 is a flow chart to describe a searching process of the server device in accordance with the embodiment of the present invention;

FIG. 7 is a constitution of measurement information in accordance with the embodiment of the present invention;

FIG. 8 offers a raw information management table in accordance with the embodiment of the present invention;

FIG. 9 is a measurement information management table in accordance with the embodiment of the present invention;

FIG. 10 is a display example in accordance with the embodiment of the present invention;

FIG. 11 is a view showing measurement information acquired by a measurement information acquisition unit of the server device in accordance with the embodiment of the present invention;

FIG. 14 is a view showing measurement information acquired by the measurement information acquisition unit of the server device in accordance with the embodiment of the present invention;

BEST MODE FOR CARRYING OUT THE INVENTION

Figure 1:
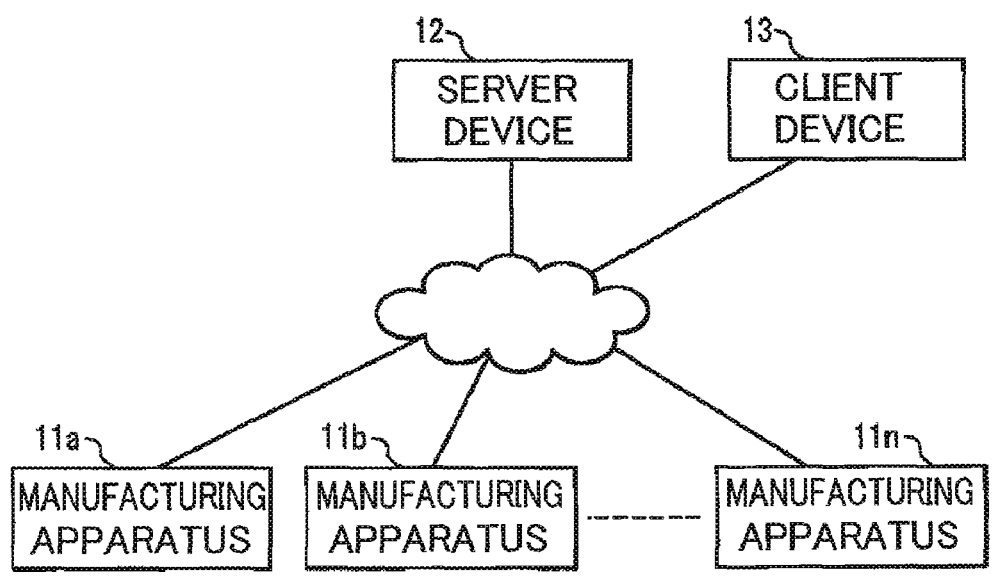
FIG. 1 is a conceptual diagram of a group management system in accordance with an embodiment of the present invention.

Hereinafter, a server device and so forth in accordance with embodiments of the present invention will be described in detail with reference to the accompanying drawings. In the embodiments, elements assigned like reference numerals are operated in the same way, so that redundant description thereof may be omitted.

Embodiment

FIG. 1 is a conceptual diagram of a group management system in accordance with an embodiment of the present invention. The group management system is a system for managing manufacturing apparatuses such as a semiconductor manufacturing apparatus, a liquid crystal panel manufacturing apparatus or the like. Further, the group management system includes one or more manufacturing apparatuses 11 (from manufacturing apparatuses 11a and 11b to a manufacturing apparatus 11n (here, n represents a random number)), a server device 12 and a client device 13.

Figure 2:
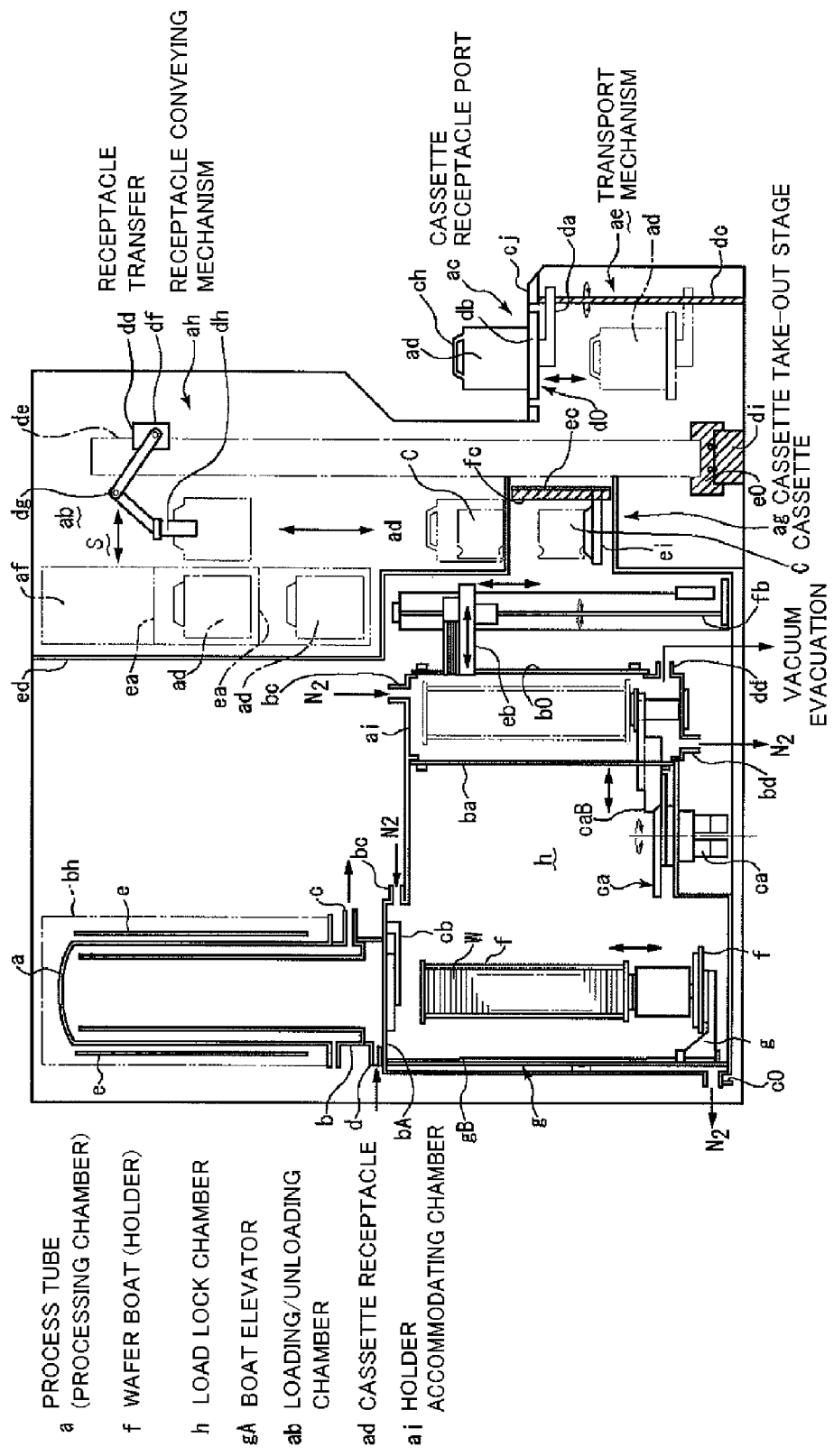
FIG. 2 is an example of a manufacturing apparatus in accordance with the embodiment of the present invention.

The manufacturing apparatus 11 is an apparatus for performing a preset process on a target substrate, e.g., a semiconductor wafer and the like. The manufacturing apparatus 11 performs various processes such as a film forming process, an etching process, a thermal oxidation process, and the like on the target substrate. The manufacturing apparatus 11 is, for example, a batch type vertical heat treatment apparatus disclosed in the above-stated Patent Document 2 or Patent Document 3. An example of the manufacturing apparatus 11 is illustrated in FIG. 2. The manufacturing apparatus 11 is an apparatus having, as a loading chamber, a so-called load lock chamber structure capable of being airtightly sealed against other chambers while allowing a supply or a vacuum exhaust of an $N_2$ gas as a nonreactive atmosphere. The manufacturing apparatus 11 includes, as major components, a process tube a serving as a processing chamber for performing a preset process on a wafer W which is a target object to be processed; a load lock chamber h serving as a loading chamber having a transfer mechanism g for loading or unloading a wafer boat f into or from the process tube a, wherein the wafer boat f serves as a holder for accommodating therein a number of, for example, 100 sheets of wafer W; a loading/unloading chamber ab for loading or unloading the wafer W into or from the load lock chamber h; a cassette receptacle port ac formed inside the loading/unloading chamber ab; a transport mechanism ae for transporting a cassette receptacle ad loaded on the port ac into the loading/unloading chamber ab; a receptacle storage stage af for temporarily storing therein the transported cassette receptacle ad; a cassette take-out stage ag for taking out a cassette C accommodated in the cassette receptacle ad; a receptacle conveying mechanism ah for performing a conveyance of the cassette receptacle ad within the loading/unloading chamber ab; and a holder accommodating chamber ai disposed between the load lock chamber h and the loading/unloading chamber ab, for accommodating the wafer boat f therein. Further, since other components of the example manufacturing apparatus 11 in FIG. 2 and their operations are already known (see Patent Document 2), their detailed description will be omitted. Furthermore, a chamber as shown in FIG. 1 of Patent Document 3 is desirable as a chamber for constituting the manufacturing apparatus 11.

Further, the manufacturing apparatus 11 stores therein, for example, a recipe which is information upon a specific process for the wafer, and the manufacturing apparatus 11 is controlled by using the recipe.

Further, the server device 12 constitutes a so-called group management system, and it stores therein various measurement information obtained from the one or more manufacturing apparatuses 11 and has a function of performing a fault detection on the measurement information.

Further, the client device 13 sends various requests to the server device 12, and receives processed results from the server device 12.

Figure 3:
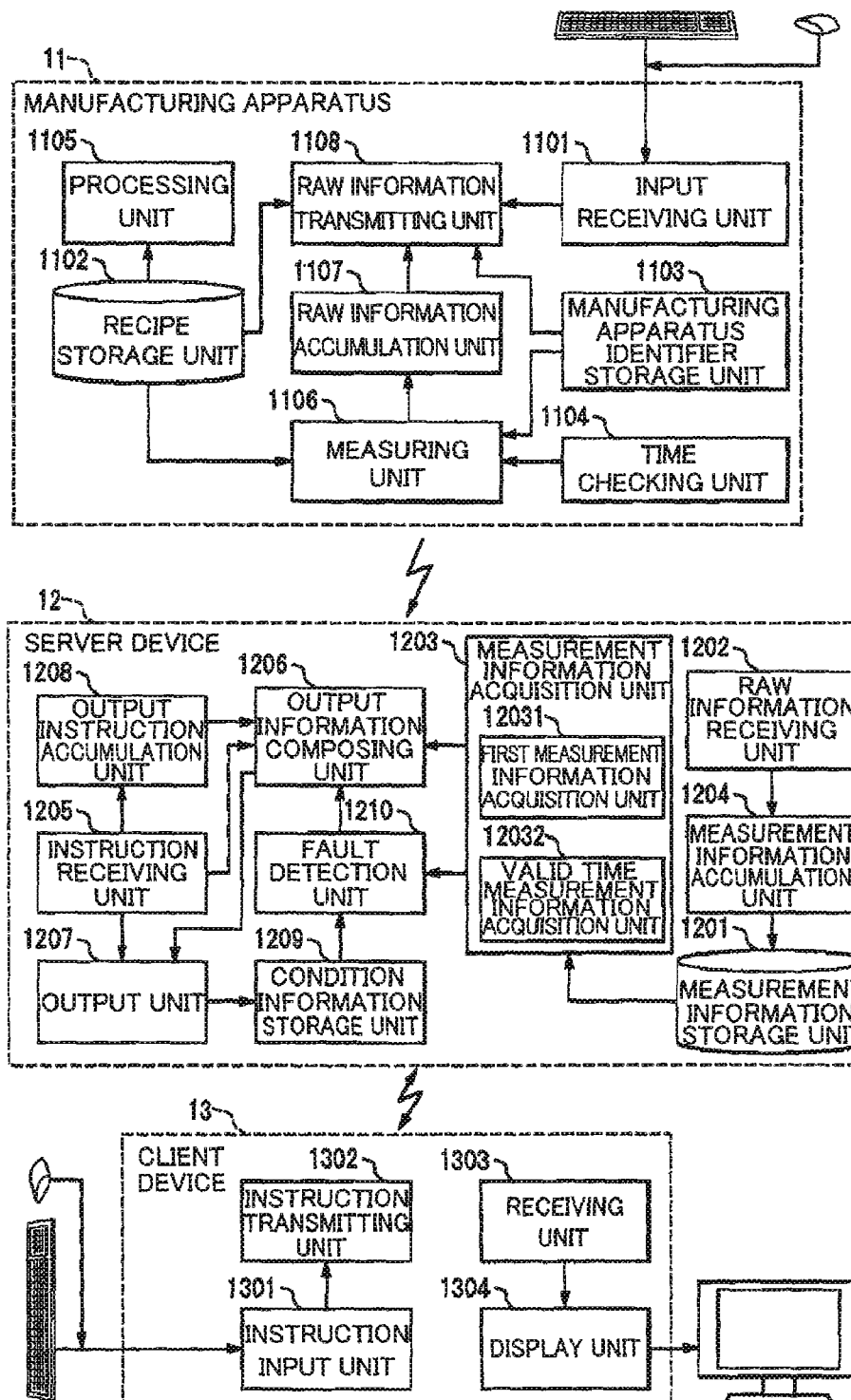
FIG. 3 is a block diagram of the group management system in accordance with the embodiment of the present invention.

FIG. 3 is a block diagram of the group management system in accordance with the embodiment of the present invention.

The manufacturing apparatus 11 includes an input receiving unit 1101, a recipe storage unit 1102, a manufacturing apparatus identifier storage unit 1103, a time measuring unit 1104, a processing unit 1105, a measuring unit 1106, a raw information accumulation unit 1107, and a raw information transmitting unit 1108.

The server device 12 includes a measurement information storage unit 1201, a raw information receiving unit 1202, a measurement information acquisition unit 1203, a measurement information accumulation unit 1204, an instruction receiving unit 1205, an output information composing unit 1206, an output unit 1207, an output instruction accumulation unit 1208, a condition information storage unit 1209, and a fault detection unit 1210.

The measurement information acquisition unit 1203 includes a first measurement information acquisition unit and a valid time measurement information acquisition unit 12032.

The client device 13 includes an instruction input unit 1301, an instruction transmitting unit 1302, a receiving unit 1303, and a display unit 1304.

The input receiving unit 1101 receives various inputs from a user of the manufacturing apparatus 11. The inputs can be a recipe, a recipe identifier for identifying the recipe, or a process execution instruction such as a wafer processing instruction and the like. An input unit for receiving various inputs from the user can be any of various types, such as a ten key, a keyboard, a mouse, a menu screen and the like. The input receiving unit 1101 can be implemented by a device driver of the input unit such as a ten key or a keyboard, or menu screen control software.

The recipe storage unit 1102 stores therein the recipe for use in controlling the manufacturing apparatus 11. The recipe is information on a preset process performed by the manufacturing apparatus 11 and information specifying a process condition including, e.g., a manufacture parameter and the like. Further, the recipe typically includes information on a plurality of sequences constituting a process or information on setting process parameters for the plurality of sequences. Each of the sequences constituting the recipe is commonly called a recipe step or a step. The process parameter information includes, e.g., a category name, an item name, a parameter name and a value. The category name indicates the kind of a process parameter, and it can be, for example, [temperature], [gas flow rate], [speed of boat elevator] or the like. The item name indicates the property of the process parameter, and it can be, for example, [speed of vertical movement], [speed of rotation] or the like. The parameter name indicates the name of the process parameter, and it can be, for example, [C], [A] or the like. The value indicates a value assigned to a variable called the process parameter. Typically, the recipe is stored in a pair with a recipe identifier (e.g., recipe name) for identifying the recipe. Further, the recipe is stored in the recipe storage unit 1102 together with a recipe step identifier which is an identifier of the recipe step constituting the recipe. The recipe step identifier can be, for example, a name of the recipe step, an identification number, or the like. Though the recipe storage unit 1102 is desirably a non-volatile storage medium, it can also be implemented by a volatile storage medium.

The manufacturing apparatus identifier storage unit 1103 stores therein a manufacturing apparatus identifier for identifying the manufacturing apparatus 11. The manufacturing apparatus identifier may be information which can identify each of the manufacturing apparatuses 11, for example, an apparatus name, a type number, a manufacture number, an identification number or a name designated for each of the manufacturing apparatuses 11, or the like. The manufacturing apparatus identifier may be information received by the input receiving unit 1101 or information previously stored in the manufacturing apparatus. Though the manufacturing apparatus identifier storage unit 1103 is desirably a nonvolatile storage medium such as a hard disk, a ROM or the like, but it can also be a volatile storage medium such as a RAM or the like.

The time measuring unit 1104 measures time. The time measuring unit 1104 outputs time information, which is acquired as a result of measuring time, to the measurement unit 1106. Here, the time information may include information of year, month and date. The time measured by the time measuring unit 1104 may be an absolute time or a relative time. The time measuring unit 1104 is realized by, e.g., a clock or the like.

The processing unit 1105 reads a recipe of the recipe storage unit 1102 and performs a preset process on a target substrate according to the recipe. Typically, the processing unit 1105 can be realized by an MPU, a memory or the like. The processing sequence of the processing unit 1105 is typically realized by software, which is stored in a storage medium such as a ROM. However, it is also possible to realize the processing sequence by using hardware (a dedicated circuit).

The measuring unit 1106 measures the temperature, the gas flow rate, the pressure or the power within the manufacturing apparatus 11, and obtains raw information which becomes a basis of measurement information to be charted. The raw information is information such as a temperature measurement or the like. The measuring unit 1106 performs the measurement, e.g., at a regular or irregular predetermined time interval. The raw information typically includes time information indicating measurement time. The time information is obtained from, e.g., the time measuring unit 1104. It is desirable that the raw information includes a recipe identifier for identifying a recipe processed when the measuring unit 1106 measures the temperature or the like; measurement values; and time information indicating the measurement times. Further, it is desirable to include a recipe step identifier for identifying a recipe step performed during the measurement. Furthermore, the recipe identifier or the recipe step identifier may be information capable of identifying a recipe or a recipe step, and, e.g., a name of recipe or recipe step, an identification number of recipe or recipe step, or the like can be used. The recipe identifier or the recipe step identifier is obtained from the recipe storage unit 1102. Further, it may be possible that the raw information includes a manufacturing apparatus identifier of the manufacturing apparatus 11 performing a recipe. This manufacturing apparatus identifier is obtained from, e.g., the manufacturing apparatus identifier storage unit 1103. Further, the raw information may include information for identifying a measurement object such as the temperature or the gas pressure, and a measurement location such as the inside of the processing tube, which are measured by the measuring unit 1106. For example, the information may be a name of the measurement object and a name of the measurement location or may be identification information corresponding thereto. It is possible for the measuring unit 1106 to measure plural values such as the temperature and the gas flow rate, or temperatures at plural locations. That is, it is possible that the raw information includes more than one kind of measurement values. The measuring unit 1106 can be realized by sensors such as one or more temperature sensors or one or more flow rate sensors.

The raw information accumulation unit 1107 accumulates the raw information obtained by the measuring unit 1106 in a non-illustrated storage medium. Typically, the raw information accumulation unit 1107 can be implemented by, e.g., an MPU and a memory. Typically, the processing sequence of the raw information accumulation unit 1107 is realized by software, which is stored in a storage medium such as a ROM. However, it is also possible to realize the processing sequence by using hardware (a dedicated circuit). Furthermore, though the non-illustrated storage medium is desirably a non-volatile storage medium, it can also be implemented by a volatile storage medium.

The raw information transmitting unit 1108 transmits the raw information accumulated by the raw information accumulation unit 1107 to the server device 12. Here, there is no specific limitation in implementing a trigger for the transmission of the raw information. Further, the raw information transmitted by the raw information transmitting unit 1108 includes one or more measurement values (e.g., the temperature and the gas flow rate) and time information. Further, it is desirable that the raw information transmitted by the raw information transmitting unit 1108 includes a recipe step identifier for identifying a recipe step. Furthermore, it is desirable that the raw information transmitted by the raw information transmitting unit 1108 includes a manufacturing apparatus identifier for identifying the manufacturing apparatus 11 or a recipe identifier for identifying a recipe. Further, the raw information may include information for identifying a measurement target such as the temperature or the gas pressure, or a measurement location such as the inside of the processing tube, which is measured by the measuring unit 1106. Besides, it is possible that the raw information accumulated by the raw information accumulation unit 1107 has a different structure or component from that of the raw information transmitted by the raw information transmitting unit 1108. Further, the raw information may include at least one of a single manufacturing apparatus identifier, a single recipe identifier and a single recipe step identifier for plural measurement values. The raw information transmitting unit 1108 can be realized by a wired or wireless communication means or the like. Furthermore, it may be also possible that the raw information transmitting unit 1108 reads the recipe step identifier, the recipe identifier or the manufacturing apparatus identifier from the recipe storage unit 1102 or the manufacturing apparatus identifier storage unit 1103, respectively, and adds it to the raw information prior to transmitting the raw information to the server device 12. Further, it may be possible for the raw information transmitting unit 1108 to transmit the raw information whenever a value (e.g., gas flow rate) is measured, or to transmit a collected raw information of a preset number of measurement values (e.g., collected raw information of 10 measurement values) at the same time. There is no specific limitation in a unit or structure of the data transmitted by the raw information transmitting unit 1108. Furthermore, the process of Composing the to-be-transmitted raw information can be carried out by the raw information accumulation unit 1107 instead of the raw information transmitting unit 1108. There is no specific limitation in transmission timing of the measured raw information, the manufacturing apparatus identifier, the recipe identifier or the recipe step identifier.

The measurement information storage unit 1201 can store therein a plurality of measurement information. The plurality of measurement information are time sequential information containing one or more kinds of information (e.g., the temperature or the pressure) measured in the one or more manufacturing apparatuses 11, and are information containing time information indicating time and measurement values when a preset process is performed in the manufacturing apparatus. Further, the plurality of measurement information may include a manufacturing apparatus identifier for identifying the manufacturing apparatus 11, a recipe identifier, a recipe step identifier or the like. The measurement information may be information acquired by performing a preset calculation on a plurality of raw information, which is received by the raw information receiving unit 1202, by the measurement information acquisition unit 1203 or it may be the same information as the raw information. Though the measurement information storage unit 1201 is desirably a non-volatile storage medium, but it can also be implemented by a volatile storage medium. Further, the measurement information of the measurement information storage unit 1201 may be information accumulated by the measurement information accumulation unit 1204, information directly received from the manufacturing apparatuses 11 or information read from a non-illustrated storage medium.

The raw information receiving unit 1202 receives, from the one or more manufacturing apparatuses 11, the raw information which is a basis of the plurality of measurement information. The raw information receiving unit 1202 can be implemented by a wireless or wired communication means or the like.

The measurement information accumulation unit 1204 accumulates, in the measurement information storage unit 1201, measurement information according to the plurality of raw information received by the raw information receiving unit 1201. The measurement information may be information acquired by performing a preset calculation on the plurality of raw information, which are received by the raw information receiving unit 1202, by the measurement information acquisition unit 1203 or it may be the same information as the raw information. Here, the preset calculation refers to a calculation performed at a preset time interval to acquire, for example, a mean value, a maximum value, a minimum value, a normalized value, a standard deviation or a median value of plural values of the plurality of raw information. Further, in case that the plurality of measurement information acquired by the measurement information acquisition unit 1203 is stored in the measurement information storage unit 1201, the accumulation process performed by the measurement information accumulation unit 1204 becomes to have the same meaning as an NOP (No Operation). Typically, the measurement information accumulation unit 1204 can be implemented by an MPU and a memory, or the like. Typically, the processing sequence of the measurement information accumulation unit 1204 is implemented by software, which is stored in a storage medium such as a ROM or the like. Here, hardware (a dedicated circuit) may be also possible for the implementation.

The instruction receiving unit 1205 receives instructions. Though the instructions are typically received from the client device 13, they can also be received from a keyboard, a mouse or the like connected with the server device 12. The instruction received by the instruction receiving unit 1205 is, e.g., an output instruction of the measurement information stored in the measurement information storage unit 1201, and the output instruction includes information specifying a predetermined start point and information on a valid time during which the measurement information is acquired. To be specific, ⌈information specifying a predetermined start point⌋ is information for specifying a desired start point among the time information contained in the measurement information, and is used for specifying the measurement information to be outputted among the time sequential measurement information accumulated in the server device 12. Accordingly, ⌈information specifying a predetermined start point⌋ can be any information that allows the measurement information acquisition unit 1203 to specify a start point for acquiring the measurement information. To be more specific, ⌈Information specifying a predetermined start point⌋ is information specifying a start point of only a part in the recipe step. For example, ⌈information specifying a predetermined start point⌋ may be information designating a start point as time, e.g., 1:10 p.m. or the like. Further, ⌈information specifying a start point⌋ can be, for example, a specific recipe step identifier. In this case, a start time of the recipe step is set as a start point. In addition, with respect to the measurement information and the like, ⌈information specifying a start point⌋ may be information for setting a condition related to the measurement information. For example, ⌈a measurement information condition⌋ is a condition for designating a value of the measurement information, a value range thereof or the like. For example, it is a condition for designating a value or a value range of the temperature, the pressure, the gas flow rate, the power or the like, which is an example of the measurement information. In this case, a time point satisfying the condition is set as a start point. As a specific example, a time point when one of the measurement information such as the temperature or the gas flow rate satisfies a predetermined value, e.g., a time point when the temperature reaches 300° C. or higher or a time point when the gas flow rate reaches 100 SCCM may be set as a start point. To be specific, ⌈valid time information⌋ is information designating a time period, i.e., a time during which the measurement information is acquired. For example, ⌈valid time information⌋ is information for indicating a period of time such as for 5 minutes or for 1 hour. For example, when the instruction receiving unit 1205 receives the measurement information output instruction including the information specifying the predetermined start point and the information on the valid time during which the measurement information is acquired, the measurement information acquisition unit 1203 to be described later starts to acquire the measurement information corresponding to times within the length of the valid time, starting from the measurement information corresponding to a time designating the start point. Here, the time can be an absolute time such as a standard time in different locations or a relative time such as a time obtained when setting a clock or the like in the group management system as a reference time. Further, in addition to the information specifying the predetermined start point and the valid time information, the output instruction may further include information, e.g., a recipe step identifier, for designating a recipe step so as to output the measurement information ranging from the predetermined start point in the designated recipe step to a time point indicated by the valid time information. Moreover, the output instruction may further include information, e.g., a recipe identifier, for designating a recipe in order to output the measurement information in the designated recipe. Typically, the recipe identifier or recipe step identifier is used for designating the measurement information, which corresponds to a plurality of recipes or recipe steps and has the same identifier in the one or more manufacturing apparatuses. Furthermore, the output instruction may further include information, e.g., a manufacturing apparatus identifier, for designating at least one of the one or more manufacturing apparatuses 11 for outputting the measurement information of a specific manufacturing apparatus among the one or more manufacturing apparatuses 11. Furthermore, the output instruction may include information for designating how to output the measurement information obtained during the valid time starting from the start point. The output instruction may be, for example, an instruction to output the measurement information as a desired data type or an instruction to output the measurement information as a chart, or it may be an instruction to output a result of a specific analysis or process, e.g., a multivariate analysis or a statistical analysis, by using the measurement information. Further, it may be an instruction to perform a fault detection, a fault analysis or the like by using the measurement information. Further, the output instruction may include information on a kind of an output chart such as an SPC chart, a correlation chart, an MD chart or the like. Further, the output instruction may include information for designating a data type, e.g., the temperature, the gas flow rate, the pressure or the like, of the measurement information which is outputted as a chart. In addition, the output instruction may include information on the property of a dot or a line constituting the chart. The property information contains colors and types (shapes) of a dot, colors and types of a line, and the like. The instruction receiving unit 1205 is made up of, for example, a wireless or wired receiving means. An input means for inputting the instructions can be implemented in various ways, and, for example, it can be a ten key, a keyboard, a mouse, a menu screen or the like. The instruction receiving unit 1205 may be implemented by a device driver of the input means such as the ten key or the keyboard, or control software of the menu screen, or the like.

The measurement information acquisition unit 1203 acquires, from the measurement information storage unit 1201, the measurement information ranging from the predetermined start point to a time point indicated by the valid time information according to an output instruction of the measurement information including the information specifying the predetermined start point and the information of the valid time received by the instruction receiving unit 1205. To be specific, according to the information specifying the predetermined start point and the valid time information contained in the output instruction, acquired is the measurement information containing the time information corresponding to each time ranging from the predetermined start point specified by the information specifying the predetermined start point to the time point indicated by the valid time information. Further, to be specific, the valid time information is information for specifying a time period, i.e., only a partial time in a recipe step, but it excludes information for designating a whole time period of a certain recipe step. To be specific, if the output instruction includes a start time point represented by the information specifying the predetermined start point and the valid time information, acquired is the measurement information ranging from the start time point to the time point indicated by the valid time information, i.e., until the valid time elapses. Further, for example, if the output instruction includes a recipe step identifier represented by the information specifying the predetermined start point and the valid time information, acquired is the measurement information ranging from the start time point of the recipe step identified by the recipe step identifier to the time indicated by the valid time information, i.e., until the valid time elapses. Furthermore, if the output instruction includes a condition related to the measurement information specifying the predetermined start point and the valid time information, acquired is the measurement information ranging from a time point when the measurement information initially satisfying the measurement information condition is obtained to the time point indicated by the valid time information, i.e., until the valid time elapses. As described above, [the measurement information condition] is a condition designating a value or a range of the value of the measurement information. To be specific, if there is a measurement value such as the temperature, the pressure, the gas flow rate or the like as one of the measurement information, a time when the temperature reaches a predetermined value satisfying [the condition related to the measurement information] is set as the start point. Further, it may be possible that when the output instruction includes the recipe step identifier in addition to the condition related to the measurement information for specifying the start point and the information of the valid time, acquired is the measurement information ranging from a time point when the measurement information, which initially satisfies the condition of the measurement value among the measurement information in the recipe step corresponding to the recipe step identifier, is obtained to the time point indicated by the valid time information, i.e., to an end time point when the valid time elapses. Further, as stated below, a range in which the measurement information is acquired may be varied depending on various conditions of the information specifying the start point, for example, a variation of the value of the measurement information or a processing time of the recipe step. For example, in case that an end time of the valid time from a certain start point arrives later than an end time of the recipe step including such a start point, the measurement information until the recipe step ends may be acquired. Further, as stated above, if the information specifying the start point is, e.g., the recipe step identifier and the measurement information acquisition unit 1203 acquires the measurement information starting from the start time point of the recipe step identified by the recipe step identifier, it may be possible for the measurement information acquisition unit 1203 to acquire the measurement information until the end time point of the valid time or the end time point of the recipe step identified by the recipe step identifier, whichever is earlier. Further, in case of acquiring the measurement information ranging from a time point when the measurement information, which initially satisfies the measurement information condition, is obtained by using the condition related to the measurement information specifying the start point, to a time point indicated by the valid time information, i.e., the end time point when the valid time elapses, it may be possible for the measurement information acquisition unit 1203 to acquire the measurement information until the end time point of the valid time or the time point from which the acquired measurement information does not satisfy the measurement information condition anymore, whichever is earlier. Furthermore, as stated above, if the information specifying the start point is the condition related to the measurement information and the output instruction contains the recipe step identifier for specifying the recipe step, among the measurement information measured in the recipe step corresponding to the recipe step identifier, it may be possible to acquire, from a time point when the measurement information initially satisfying the condition of the measurement value is obtained, the measurement information until the end time point of the valid time, the end time point of the recipe step identified by the recipe step identifier, or the time point from which the acquired measurement information does not satisfy the condition of the measurement value anymore, whichever is the earliest. Furthermore, if the output instruction includes the above-mentioned measurement information condition as the information for specifying the end time point for ending the acquisition of the measurement information in addition to the information specifying the start point and the valid time information, it may be possible, when the measurement information initially dissatisfying the measurement information condition for specifying the end time point is acquired, to acquire the measurement information, by considering this time point as the end time point, not exceeding the time point indicated by the valid time information, within the valid time after a time point set as the start point. In this case, the condition related to the measurement information may not be the same as the condition related to the measurement information for specifying the start point. Typically, the measurement information acquisition unit 1203 can be realized by an MPU, a memory or the like. The processing sequence of the measurement information acquisition unit 1203 is typically realized by software, which is stored in a storage medium such as a ROM. However, it is also possible to realize the processing sequence by using hardware (a dedicated circuit).

The first measurement information acquisition unit 12031 acquires the measurement information which initially satisfies the measurement information condition included in the output instruction. To be specific, if the output instruction includes the condition related to the measurement information and information of the valid time during which the measurement information is acquired, and a predetermined start point of acquiring the measurement information is set as a time point satisfying the measurement information condition, the first measurement information acquisition unit 12031 acquires the measurement information initially satisfying the measurement information condition included in the output instruction. Further, the first measurement information acquisition unit 12031 may acquire the measurement information corresponding to the recipe step identifier contained in the output instruction and initially satisfying the measurement information condition included in the output instruction. To be specific, in case that the output instruction includes the recipe step identifier, the measurement information condition and information of the valid time during which the measurement information is acquired, and the predetermined start point for acquiring the measurement information is set as a time point satisfying the measurement information condition in a certain recipe step identified by the recipe step identifier among the recipe steps contained in the recipe, it may be possible for the first measurement information acquisition unit 12031 to acquire the measurement information which initially satisfies the measurement information condition included in the output instruction among the measurement information corresponding to the recipe step identifier contained in the output instruction. Typically, the first measurement information acquisition unit 12031 can be realized by an MPU, a memory or the like. The processing sequence of the measurement information acquisition unit 12031 is typically realized by software, which is stored in a storage medium such as a ROM. However, it is also possible to realize the processing sequence by using hardware (a dedicated circuit). Meanwhile, if the measurement information condition is not included in the output instruction, the first measurement information acquisition unit 12031 is not necessary and may be omitted.

The valid time measurement information acquisition unit 12032 acquires the measurement information ranging from the time point when the first measurement information acquisition unit 12031 acquires the initial measurement information to the time point indicated by the valid time information. For example, the measurement information is acquired from the time indicated by the time information contained in the measurement information acquired by the first measurement information acquisition unit 12031. Further, the measurement information acquired by the first measurement information acquisition unit 12031 may not be in accord with the measurement information acquired by the valid time measurement information acquisition unit 12032. For example, the measurement information acquired by the first measurement information acquisition unit 12031 may be measurement information of the temperature, and the measurement information acquired by the valid time measurement information acquisition unit 12032 may be measurement information of the gas flow rate or the pressure. Furthermore, the valid time measurement information acquisition unit 12032 may appropriately change a range for acquiring the measurement information according to, e.g., a variation of the value of the measurement information or the time of the recipe step. To be specific, the valid time measurement information acquisition unit 12032 may acquire the measurement information until the end time point of the valid time, the end time point of the recipe step identified by the recipe step identifier, or the time point from which the acquired measurement information does not satisfy the condition of the measurement value anymore, whichever is the earliest. Typically, the valid time measurement information acquisition unit 12032 can be realized by an MPU, a memory or the like. The processing sequence of the valid time measurement information acquisition unit 12032 is typically realized by software, which is stored in a storage medium such as a ROM. However, it is also possible to realize the processing sequence by using hardware (a dedicated circuit). Meanwhile, if the measurement information condition is not included in the output instruction, the valid time measurement information acquisition unit 12032 is unnecessary and may be omitted.

The output information composing unit 1206 composes output information by using the measurement information acquired by the measurement information acquisition unit 1203. For example, the output information composing unit 1206 composes the output information in a preset type or in a type indicated by the instruction received by the instruction receiving unit 1205, in particular, in a text type, in an XML type, in a database type or the like. Further, the output information composing unit 1206 composes a chart as the output information by using the measurement information acquired by the measurement information acquisition unit 1203. Here, it is desirable that the output information composing unit 1206 composes the output information by visually distinguishing different kinds of the measurement information or the measurement information of different kinds of the manufacturing apparatuses. For example, the output information composing unit 1206 composes and outputs the output information according to the output instruction accumulated in the output instruction accumulation unit 1208. Further, it may be possible to perform a preset calculation by using the acquired measurement information and then compose the output information by using a result of the calculation. Here, the preset calculation refers to a calculation performed at a preset time interval to acquire, for example, a mean value, an accumulated value along a time axis, a maximum value, a minimum value, a normalized value, a standard deviation or a median value of plural values of a plurality of measurement information. Further, the measurement information accumulation unit 1204 may perform such a preset calculation on a plurality of raw information when the plurality of raw information received by the raw information receiving unit 1202 is accumulated. Further, the output information composing unit 1206 may compose the output information by using a determination result of the fault detection unit 1210 to be described later. For example, the output information composing unit 1206 composes a chart from the plurality of the measurement information acquired by the measurement information acquisition unit 1203, but at this time, the output information composing unit 1206 composes the output information in which measurement information having a fault is visually distinguished from normal measurement information. Here, the output information may be, for example, list information containing a name of the measuring unit and time related to the measurement information having the fault. For example, the name of the measurement unit is acquired according to information for identifying a measurement location measured by the measurement unit 1106, which is included in the measurement information. In addition, the output information may be, for example, the list information or information of the chart made up of the measurement information. The output information is, for example, information indicating normality or fault. The output information is, e.g., sound information (a buzzer or the like) notifying either normality or fault. Further, the output information composing unit 1206 may perform a process of composing a chart showing ranges of abnormal values and normal values for fault detection. In such case, though the fault detection unit 1210 is supposed to read measurement information coincident with the output instruction, there is no restriction upon whether it performs a fault detecting process or not. When more than one manufacturing apparatus identifier is contained in the output instruction, the output information composing unit 1206 desirably composes a chart in which measurement information of the different manufacturing apparatus identifiers are visually distinguished from each other. Furthermore, when more than one recipe identifier is contained in the output instruction, the output information composing unit 1206 desirably composes a chart in which measurement information of the different recipe identifiers are visually distinguished from each other. Here, when the output instruction contains more than one manufacturing apparatus identifier, the chart allowing the visual distinction between the measurement information of the different manufacturing apparatus identifiers is a chart in which the measurement information of the different manufacturing apparatus identifiers is outputted in different types (shapes such as a rectangle and a circle, colors, and sizes) of dots, a chart in which the measurement information of the different manufacturing apparatus identifiers is connected by different colors of lines, or the like. Meanwhile, when the output instruction contains only one manufacturing apparatus identifier, the chart allowing the visual distinction between the measurement information of the different manufacturing apparatus identifiers implies a chart including a plurality of measurement information of that single manufacturing apparatus identifier. Furthermore, when the output instruction contains more than one recipe identifier, the chart allowing the visual distinction between the measurement information of the different recipe identifiers is a chart in which the measurement information of the different recipe identifiers is outputted in different types (shapes such as a rectangle and a circle, colors and sizes) of dots, a chart in which the measurement information of the different recipe identifiers is connected by different types of lines (a solid line, a dashed line, and so forth), or the like. Meanwhile, when the output instruction contains only one recipe identifier, the chart allowing the visual distinction between the measurement information of the different recipe identifiers implies a chart including a plurality of measurement information of that single recipe identifier. Moreover, the output information composing unit 1206 may compose, from the read plurality of measurement information, an SPC chart (statistical process management chart) which is a chart allowing a visual distinction of the measurement information of the different manufacturing apparatus identifiers and plotting the read plurality of measurement information according to a time sequence indicated by the time information of any one type of measurement information. The SPC chart is a chart used for a statistical process management and a chart for performing fault detection by monitoring the single variable. On the SPC chart, it is desirable that a maximum value and a minimum value management values) of a target object to be monitored are preset, and when a monitored value falls beyond the range of such management values, the fault detection unit 1210 detects a fault and the detected fault is visually displayed. The maximum value is stored in, e.g., the condition information storage unit 1209 to be described later in advance. Furthermore, when the output instruction contains more than one manufacturing apparatus identifier, the output information composing unit 1206 may compose, from a plurality of measurement information having any one of the more than one manufacturing apparatus identifier, a correlation chart which is a chart capable of visually distinguishing the measurement information of the different manufacturing apparatus identifiers and showing a correlation between two kinds of measurement information. The correlation chart is a chart for monitoring a correlation between two variables, and a chart capable of detecting the fault from the two variables. Furthermore, when the output instruction contains more than one recipe identifier, the output information composing unit 1206 may compose an MD (Mahalanobis Distance) chart which is a chart capable of visually distinguishing the measurement information of the different recipe identifiers and showing a correlation between three or more kinds of measurement information. The chart composition is a process of acquiring a chart by, for example, connecting a plurality of measurement information by a line along a time axis. Since a method of composing a chart when a plurality of measurement information having values and time information is given is well-known, a detailed description thereof will be omitted. Further, since a method of composing an SPC chart, a correlation chart and an MD chart when a plurality of measurement information having values and time information is given is well-known, a detailed description thereof will be omitted. Here, the two kinds of measurement information also include information containing two kinds of measurement values (for example, the temperature and the gas flow rate) within single measurement information. Further, the three or more kinds of measurement information also include information containing three or more kinds of measurement values (for example, the temperature, the gas flow rate and the pressure) within single measurement information. Typically, the output information composing unit 1206 can be implemented by an MPU, software, or the like. The processing sequence of the output information composing unit 1206 is typically realized by software, which is stored in a storage medium such as a ROM. However, it is also possible to use hardware (a dedicated circuit) for the realization.

The output unit 1207 outputs the output information such as the chart composed by the output information composing unit 1206. Here, the term "output" typically implies a transmission to the client device 13. However, the output unit 1207 can also display the chart on a display device connected with the server device 12, print it by a printer or transmit it to an external device. The output unit 1207 can be implemented by a wireless or wired communication means. However, it is also possible to implement the output unit 1207 by driver software of an output device, or driver software of the output device together with the output device, or the like.

The output instruction accumulation unit 1208 accumulates therein an output instruction having property information of a dot or a line and a manufacturing apparatus identifier; property information of a dot or a line and a recipe identifier; or the like. For example, when the instruction receiving unit 1205 has received an accumulation instruction for accumulating a setup (including color information) of a chart, the output instruction accumulation unit 1208 may accumulate therein an output instruction having property information of a dot or a line and a manufacturing apparatus identifier or property information of a dot or a line and a recipe identifier. Furthermore, the output instruction accumulation unit 1208 can be typically implemented by an MPU, a memory, or the like. The processing sequence of the output instruction accumulation unit 1208 is typically realized by software, which is stored in a storage medium such as a ROM. However, it is also possible to use hardware (a dedicated circuit) for the realization.

The condition information storage unit 1209 stores therein condition information related to conditions for the fault detection. The condition information includes, for example, a maximum value and a minimum value defining a normal range of measurement values. The condition information may include, for example, only a boundary value between a normal value and an abnormal value. These values are typically called management values. Besides, the condition information may be varied depending on values to be measured (the temperature, the pressure, the gas flow rate, the power amount and so forth). In addition, there is no specific restriction in a structure of the condition information. Though the condition information storage unit 1209 is desirably a non-volatile storage medium, it can also be implemented by a volatile storage medium.

The fault detection unit 1210 determines whether the measurement values of the measurement information acquired by the measurement information acquisition unit 1203 are normal or abnormal. The fault detection unit 1210 determines whether the measurement values of the measurement information are normal or abnormal by using the condition information of the condition information storage unit 1209. To be specific, when the measurement information acquisition unit 1203 acquires the measurement information, the fault detection unit 1210 determines whether or not each of the measurement information satisfies the condition information. Typically, the fault detection unit 1210 can be implemented by an MPU, a memory, or the like. The processing sequence of the fault detection unit 1210 is typically realized by software, which is stored in a storage medium such as a ROM. However, it is also possible to use hardware (a dedicated circuit) for the realization. Moreover, the fault detection process in the fault detection unit 1210 may be realized by a well-known fault detection process.

The instruction input unit 1301 inputs various instructions. The various instructions include, for example, the output instruction of the measurement information accumulated in the server device 12 as described above. Further, the various instructions include, for example, an instruction of startup, an instruction of chart output, an instruction of change of chart property values (type and color of lines, type and color of dots, and so forth), or the like. A means for inputting the instructions can be a ten key, a keyboard, a mouse, a menu screen or the like, though not limited thereto. The instruction input unit 1301 can be implemented by the input means such as the ten key, the keyboard or the like, a device driver thereof, control software of the menu screen, or the like.

The instruction transmitting unit 1302 transmits the instruction inputted by the instruction input unit 1301 to the server device 12. Here, the term "transmitting" typically means a transmission by a communication means. The instruction transmitting unit 1302 can be implemented by a wired or wireless communication means or the like.

The receiving unlit 1303 receives the output information such as the chart from the server device 12. Here, the term receiving typically means reception by a communication means. The receiving unit 1303 can be implemented by a wired or wireless communication means or the like.

The display unit 1304 displays, on a display, the output information such as the chart or the like received by the receiving unit 1303. Further, if the receiving unit 1303 receives, from the server device 12, the output information in a text type, an XML type, a database type or the like, the display unit 1304 may be provided with an MPU or a memory for composing display data from the output information, so that the display unit 1304 may compose the display output information such as the chart or the like in the same wave as the output information composing unit 1206, and display the output information on the display. The display unit 1304 may or may not include the display. It is possible to realize the display unit 1304 by driver software of the display, driver software of the display together with the display, or the like.

Hereinafter, an operation of the group management system will be explained. First of all, an operation of the manufacturing apparatus 11 will be explained with reference to a flow chart shown in FIG. 4. Further, a case where the raw information includes a recipe step identifier corresponding to a recipe step executed during the measurement will be explained.

(Step S401) The processing unit 1105 reads a recipe from the recipe storage unit 1102.

(Step S402) The processing unit 1105 substitutes 1 for a counter i.

(Step S403) The processing unit 1105 determines whether or not $i^{th}$ recipe step exists in the recipe read at step S401. If the $i^{th}$ recipe step exists, the process proceeds to step S404; otherwise, the process proceeds to step S411.

(Step S404) The processing unit 1105 performs the $i^{th}$ recipe step.

(Step S405) The measuring unit 1106 performs one or more kinds of predetermined measurement (e.g., the temperature and the pressure) and acquires measurement values (here, the measurement values only include one or more kinds of values, typically).

(Step S406) The measuring unit 1106 acquires time information from the time measuring unit 1104 and a recipe step identifier from the recipe storage unit 1102, and composes raw information by applying the time information and the recipe step identifier to the measurement information.

(Step S407) The raw information accumulation unit 1107 accumulates the raw information obtained in step S406 in a non-illustrated memory temporarily.

(Step S408) The processing unit 1105 determines whether or not a process of the $i^{th}$ recipe step is ended. For example, if a processing time of the $i^{th}$ recipe step is predetermined, whether the processing time elapses is determined. Further, if an ending condition of the process of the $i^{th}$ recipe step is determined, e.g., if it is predetermined that the process is supposed to end when the temperature reaches a specific temperature, determined is whether or not a processing condition is satisfied, and if satisfied, the process is determined to be ended. If the process is ended, the process proceeds to step S409; otherwise, the process returns to step S405.

(Step S409) The raw information transmitting unit 1108 transmits, to the server device 12, the raw information (a group of the one or more kinds of values, the time information and the recipe step identifier) accumulated temporarily in step S407. Further, the raw information transmitting unit 1108 retains therein information (e.g., an IP address of the server device 12 and the like) necessary to communicate with the server device 12.

(Step S410) The processing unit 1105 increments the counter i by 1 and the process returns to step S403.

(Step S411) The raw information transmitting unit 1108 reads a recipe identifier from the recipe storage unit 1102. The recipe identifier corresponds to the recipe read in step S401.

(Step S412) The raw information transmitting unit 1108 reads a manufacturing apparatus identifier from the manufacturing apparatus identifier storage unit 1103.

(Step S413) The raw information transmitting unit 1108 transmits the recipe identifier and the manufacturing apparatus identifier read in steps S410 to S411 to the server device 12. Further, the raw information transmitting unit 1108 retains therein information (e.g., the IP address of the server device 12 and the like) necessary to communicate with the server device 12. Then, the process thereof ends.

Figure 4:
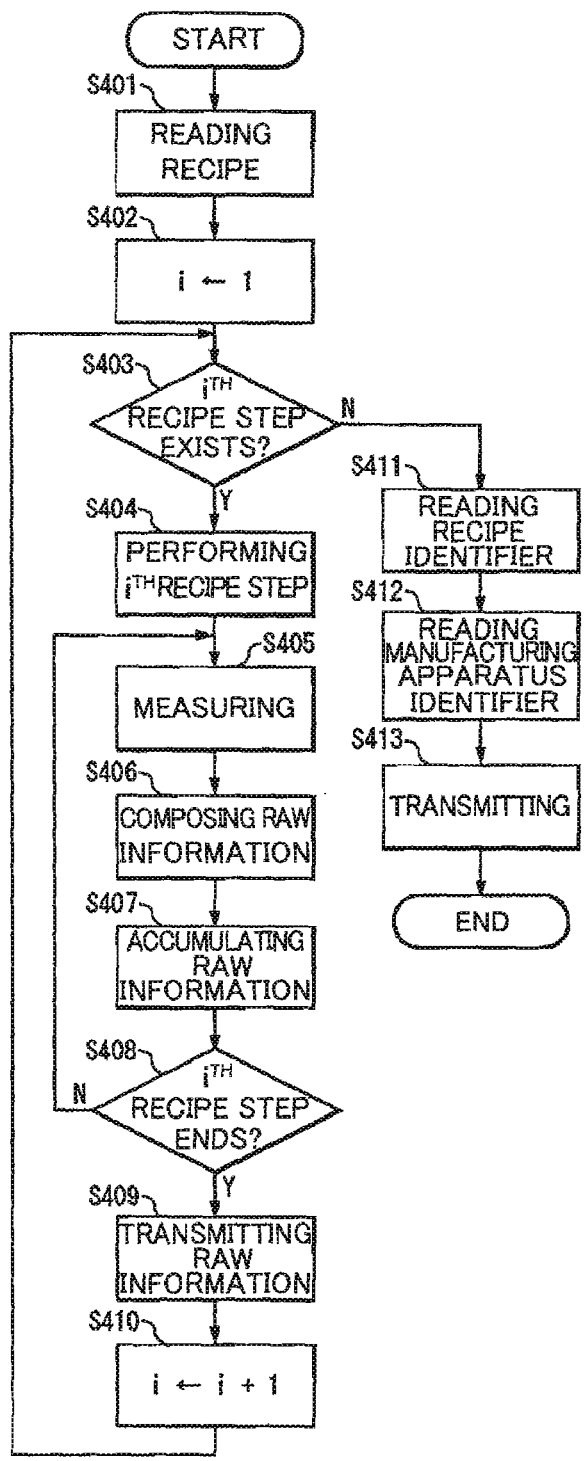
FIG. 4 is a flow chart to describe an operation of the manufacturing apparatus in accordance with the embodiment of the present invention.

Furthermore, in step S407 of the flow chart of FIG. 4, it may be possible to transmit the raw information composed by the raw information accumulation unit 1107 in step S406 to the server device 12 one by one in the same manner as in step S409, instead of temporarily accumulating it in the non-illustrated memory. In this manner, it is possible to transmit data to the server device in real-time. Further, it may be possible to transmit the manufacturing apparatus identifier or the recipe identifier at the time of starting the measurement.

Furthermore, in case that the recipe step identifier is not included in the raw information, it may be possible that the processes of steps S411 to S413 are performed after step S408, and the recipe step identifier is read from the recipe storage unit 1102 and then transmitted to the server device.

Hereinafter, an operation of the server device 12 will be explained with reference to a flowchart shown in FIG. 5. Further, a case where the output instruction received by the instruction receiving unit 1205 is an output instruction of the chart will be explained as an example.

(Step S501) The instruction receiving unit 1205 determines whether or not an instruction has been received. If so, the process goes to step S502; otherwise, the process proceeds to step S507.

(Step S502) The measurement information acquisition unit 1203 determines whether or not the instruction received in step S501 is an output instruction of the output information of the chart. If so, the process goes to step S503; otherwise, the process returns to step S501.

(Step S503) The measurement information acquisition unit 1203 acquires one or more measurement information by searching the measurement information storage unit 1201 by using, as a key, one or more manufacturing apparatus identifiers or one or more recipe identifiers, and the information specifying a predetermined start point and the valid time information, contained in the output instruction of the chart which is received in step S501. Further, the measurement information at least includes values (the temperature, the gas flow rate or the like) and time information. Further, the measurement information may include the recipe step identifier. In addition, searching by using, as a key, the information specifying the predetermined start point and the valid time information refers to acquiring the measurement information containing the time information corresponding to times within a time period, i.e., ranging from the predetermined start point specified by the information specifying this predetermined start point to a time point indicated by the valid time information. Further, searching by using, as a key, the one or more manufacturing apparatus identifiers refers to acquiring the measurement information containing any one of the one or more manufacturing apparatus identifiers. Furthermore, searching by using, as a key, the one or more recipe identifiers refers to acquiring the measurement information containing any one of the one or more recipe identifiers. Further, this process will be described in detail in FIG. 6.

(Step S504) The fault detection unit 1210 determines whether or not each measurement value contained in the one or more measurement information acquired in step S503 is normal. To be specific, the fault detection unit 1210 determines whether each measurement value is normal or abnormal by using the condition information.

(Step S505) The output information composing unit 1206 composes output information such as a chart according to the output instruction received by using the measurement information obtained in step S503. At this time, a preset calculation may be performed on the measurement information. Further, in case that the output information is a chart, property values of lines (colors or types of lines, colors or types of dots, and so forth) of the chart are instructed property values, property values of default, or the like, and the output information composing unit 1206 composes the chart by using these property values. The composed chart is a chart in which the measurement information of the different manufacturing apparatus identifiers or the measurement information of the different recipe identifiers or both of these are visually distinguishable. Furthermore, the composed chart is a chart according to chart type information (an SPC chart, a correlation chart, an MD chart, or the like) contained in the output instruction. Moreover, the output information composing unit 1206 composes the output information according to the result of the fault detection process in step S505. Here, the ⌈output information according to the result of the fault detection process⌋ may be output information specifying the fault or normality of the measurement information or a chart specifying threshold values of the fault and normality, or the like.

(Step S506) The output unit 1207 outputs the output information composed in step S505. Here, the term "output" implies a transmission to the client device 13. Then, the process returns to step S501.

(Step S507) The raw information receiving unit 1202 determines whether it has received one or more raw information from the manufacturing apparatuses 11. If so, the raw information is temporarily accumulated in a non-illustrated memory or the like and the process proceeds to step S508; otherwise, the process returns to step S501.

(Step S508) The measurement information accumulation unit 1204 acquires one or more measurement information by performing a preset calculation on the raw information received by the raw information receiving unit 1202. Performing the preset calculation on a plurality of raw information implies performing the preset calculation (calculation of a mean value, a standard deviation, a maximum value, or the like) on each of one or more kinds of values in the plural pairs of the plurality of raw information. However, it is also possible not to perform the preset calculation. Furthermore, the plurality of raw information on which the specific calculation is performed implies each of a multiplicity of raw information obtained at every predetermined time interval (for example, 10 minutes) and each of a multiplicity of raw information obtained at every preset number of steps. In addition, the measurement information accumulation unit 1204 may appropriately add the manufacturing apparatus identifier or the recipe identifier received by the raw information receiving unit 1202 to the raw information or the measurement information received by the raw information receiving unit 1202.

(Step S509) The measurement information accumulation unit 1204 accumulates the one or more measurement information acquired in step S512 in the measurement information storage unit 1201. Then, the process goes back to step S501.

Figure 5:
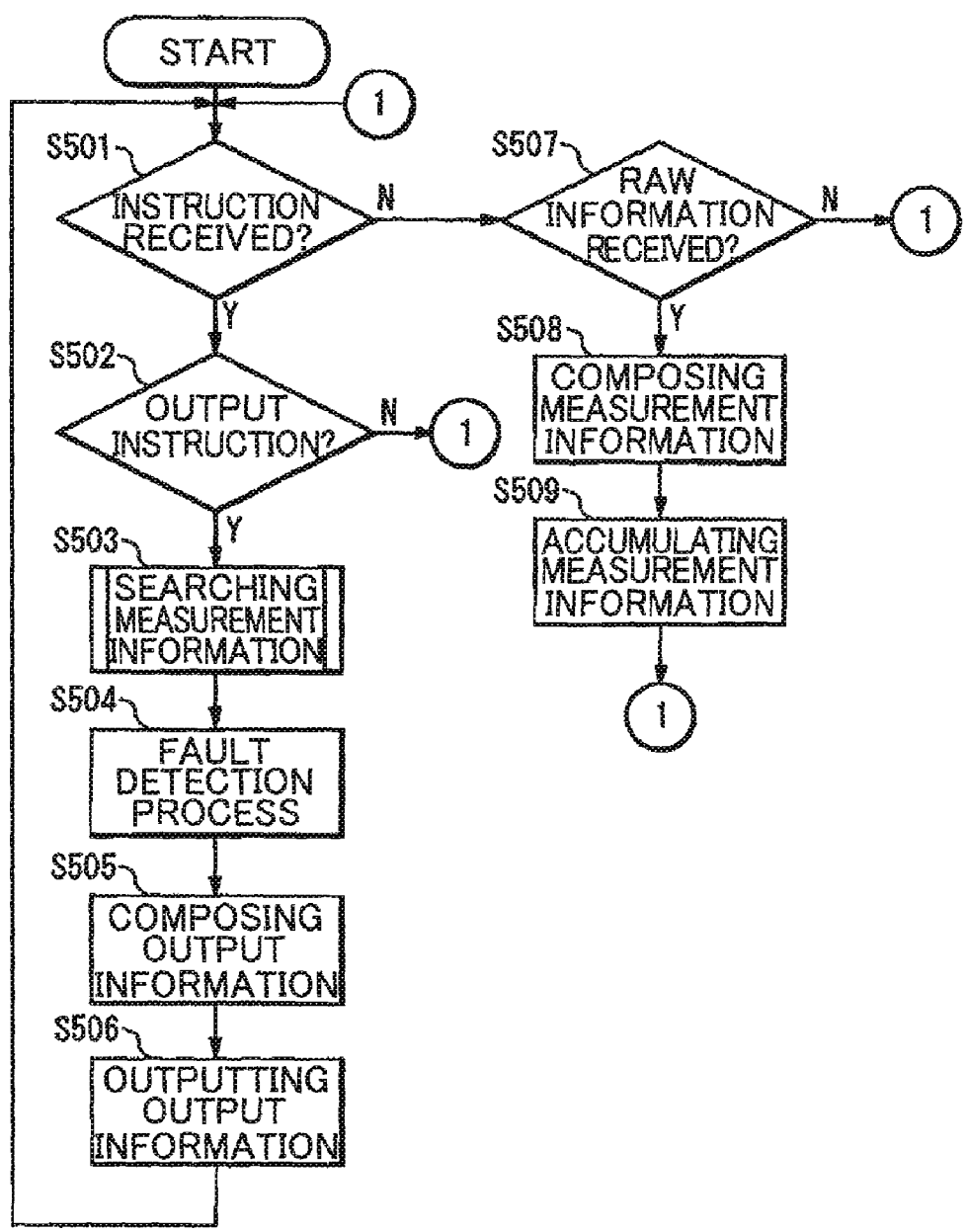
FIG. 5 presents a flow chart to describe an operation of a server device in accordance with the embodiment of the present invention.

Further, in the flowchart shown in FIG. 5, the process is terminated by an interruption of a power-off or a process termination.

Further, in the flowchart of FIG. 5, the measurement information is accumulated before the chart output instruction is received.

Furthermore, in the flowchart of FIG. 5, it may be possible that the raw information is accumulated instead of the measurement information, and when an output of the output information such as the chart is carried out, the one or more measurement information is obtained by performing the preset calculation on the plurality of raw information, and the output information is composed by using the one or more measurement information and outputted. That is, there is no specific limitation in timing for composing the measurement information.

Hereinafter, the process of searching the measurement information shown in the flow chart of FIG. 5 will be explained with reference to a flow chart shown in FIG. 6. In this case, it is assumed that the output instruction includes the recipe step identifier of the recipe step containing the measurement information to be outputted; the condition related to the measurement information for specifying a start point, i.e., the condition such as the temperature or the pressure for indicating a range of the value of the acquired measurement information; and the valid time for indicating a time period for acquiring the measurement information. Further, in this case, for a simple explanation, it is assumed that the output instruction includes the manufacturing apparatus identifier and the recipe identifier, and the measurement information is searched from the measurement information, which contains the same manufacturing apparatus identifier and recipe identifier as those contained in the output instruction, among the measurement information stored in the measurement information storage unit 1201.

(Step S601) The measurement information acquisition unit 1203 sets a counter K to be 1.

(Step S602) The first measurement information acquisition unit 12031 acquires, from the measurement information storage unit 1201, $K^{th}$ measurement information among the measurement information corresponding to the recipe step designated by the recipe step identifier.

(Step S603) The first measurement information acquisition unit 12031 determines whether or not the measurement information satisfies the measurement information condition. If so, the process proceeds to step S606; and if not, the process proceeds to step S604.

(Step S604) The measurement information acquisition unit 1203 increments the counter K by 1.

(Step S605) The first measurement information acquisition unit 12031 determines whether or not the $K^{th}$ measurement information is contained in the measurement information corresponding to the recipe step which is designated by the recipe step identifier. If so, the process returns to step S602; otherwise, the process returns to a higher-level function.

(Step S606) The valid time measurement information acquisition unit 12032 determines, from a time indicated by the time information of the measurement information satisfying the measurement information condition, whether or not the $K^{th}$ measurement information is the measurement information containing the time information exceeding the valid time. If the valid time has elapsed, the process is terminated; otherwise, the process proceeds to step S607.

(Step S607) The valid time measurement information acquisition unit 12032 accumulates the $K^{th}$ measurement information in a non-illustrated memory or the like.

(Step S608) The measurement information acquisition unit 1203 increments the counter K by 1.

(Step S609) Further, the valid time measurement information acquisition unit 12032 determines whether or not the $K^{th}$ measurement information is included in the measurement information corresponding to the recipe step which is designated by the recipe step identifier. If so, the process proceeds to step S610; otherwise, the process returns to the higher-level function.

(Step S610) The valid time measurement information acquisition unit 12032 acquires the $K^{th}$ measurement information.

(Step S611) The valid time measurement information acquisition unit 12032 determines whether the acquired $K^{th}$ measurement information satisfies the measurement information condition. If so, the process returns to step S606; otherwise, the process returns to the higher-level function.

Further, in the flow chart shown in FIG. 6, if a start time point of the recipe step is set as a start point of acquiring the measurement information without setting the measurement information condition, the processes of steps S603 to S605 may be omitted, for example. Further, in this case, since the first measurement information acquisition unit 12031 or the valid time measurement information acquisition unit 12032 can be omitted, the process performed by these units may be performed by the measurement information acquisition unit 1203.

Furthermore, in case that the condition related to the measurement information is not used as the information specifying the start point, or in case that the condition related to the measurement information is not used in determining the end point, the end point for acquiring the measurement information serves as the time point when the valid time elapses or the end time point of the recipe step, so that step S611 may be omitted.

In addition, it may be possible to set individually the condition related to the measurement information for specifying the start point, e.g., a temperature of 270 degrees or higher, and the measurement information condition for specifying the end point, e.g., a temperature of 300 degrees or higher. In this case, it may be possible to determine whether the measurement information condition for specifying the start point is satisfied in step S603, and determine whether the measurement information condition for specifying the end point is satisfied in step S611.

Though, in the above description, the case where the output instruction includes the recipe step identifier has been explained, the recipe step identifier may be excluded as long as the start point or the like can be designated. However, typically, in case of performing the fault detection by using the measurement information, since the management value or the like for determining whether or not the measurement information is in fault is set for each recipe step, it is desirable to acquire the measurement information from a single recipe step by including the recipe step identifier or the like in the output instruction.

Moreover, in the flow charts shown in FIGS. 5 and 6, it is desirable that the fault detection is started on a real-time basis as a result of a user inputting an output instruction of the output information, and the fault detection process is performed while updating the output information (chart or the like) whenever the raw information is received, and a fault, if any, is immediately informed to the user. That is, in the flow charts of FIGS. 5 and 6, it is more desirable to perform the following processes. That is, the raw information receiving unit 1202 receives the raw information which is continuously transmitted from the manufacturing apparatuses 11 on a real-time basis during the manufacture in the manufacturing apparatuses 11, and the measurement information accumulation unit 1204 accumulates the measurement information in the measurement information storage unit 1201 at least temporarily and in sequence. Further, the measurement information acquisition unit 1203 determines whether or not the measurement information accumulated in sequence satisfies the measurement information condition as illustrated in step S603, and determines whether or not the measurement information contains time information not exceeding the valid time based on a time indicated by the time information of the measurement information satisfying the condition of the start point as shown in step S606. Furthermore, if necessary, it is determined whether the measurement information corresponds to the recipe step designated by the recipe step identifier contained in the output instruction. In addition, if the measurement information accumulated in sequence satisfies all these conditions, the measurement information acquisition unit 1203 acquires the measurement information. Moreover, the fault detection unit 1210 performs the fault detection process on the measurement information. Further, by using the measurement information and the result of the fault detection process, the output information composing unit 1206 updates the output information and the output unit 1207 continuously outputs the updated output information. By these processes, the states of the manufacturing apparatuses 11 can be checked in real-time, and also a real-time fault detection can be carried out, so that the user can be allowed to acknowledge an occurrence of a fault immediately.

Hereinafter, the operation of the client device 13 will be explained. When the instruction input unit 1301 of the client device 13 receives an output instruction of the chart from the user, the instruction transmitting unit 1302 transmits the output instruction to the server device 12, and the receiving unit 1303 receives the information of the chart which is the processed result from the server device 12, and then the display unit 1304 displays the chart.

Hereinafter, a detailed operation of the group management system in accordance with the present embodiment will be explained. FIG. 1 provides a conceptual diagram of the group management system.

In this example, when the input receiving unit 1101 of the one or more manufacturing apparatuses 11 receives a startup instruction for processing a wafer from the user, the processing unit 1105 reads a recipe from the storage unit 1112 and performs a wafer processing by executing the read recipe at each recipe step. Further, during the wafer processing, the measuring unit 1106 measures the gas flow rate within a predetermined furnace at an interval of, e.g., one second, and composes the raw information made of a set of the acquired gas flow rate, the time information acquired from the time measuring unit 1104 and the recipe step identifier acquired from the recipe storage unit 1102. The composed raw information is temporarily accumulated by the raw information accumulation unit 1107. An example of the accumulated raw information is shown in FIG. 7. Here, the raw information includes the recipe step identifier, the gas flow rate and the time information. Further, the time information is information indicating time, and it may include hour, minute and second or just include date and hour. Further, the raw information may include information of a data type (a kind of data of the measurement information such as the gas flow rate, the temperature, the pressure or the like), in particular, here it may include information indicating the gas flow rate.

Furthermore, at the step when all the recipe steps constituting the recipe are finished, the raw information transmitting unit 1108 in the manufacturing apparatuses 11 transmits the raw information accumulated by the raw information accumulation unit 1107 to the server device 12. Further, the raw information transmitting unit 1108 in the manufacturing apparatuses 11 reads the manufacturing apparatus identifier in the manufacturing apparatus identifier storage unit 1103 and the recipe identifiers (recipe identifiers executed when a preset process is performed on a target substrate) in the recipe storage unit 1102, and transmits them to the server device 12. Here, though the raw information is transmitted to the server device 12 when all the recipe steps are completed, it may be possible to transmit the raw information to the server device 12 in real-time, for example, whenever a single raw information is acquired.

Thereafter, the raw information receiving unit 1202 of the server device 12 receives the raw information made of a group of the recipe step identifier, the gas flow rate and the time information. Further it receives the manufacturing apparatus identifier and the recipe identifier. Further, the measurement information accumulation unit 1204 accumulates, in a non-illustrated memory, the raw information containing a plurality of groups of the recipe step identifier, the gas flow rate and the time information; the recipe identifier; and the manufacturing apparatus identifier. An example of the raw information is shown in FIG. 8. FIG. 8 provides a raw information management table. The raw information management table includes [manufacturing apparatus identifier], [recipe identifier], [recipe step identifier], [value (gas flow rate)] and [time information]. The raw information management table of FIG. 8 shows a data structure in which a plurality of groups of values (here, only one kind of value), the recipe step identifiers and the time information correspond to a single manufacturing apparatus identifier and a single recipe identifier. Further, in FIG. 8, the raw information corresponding to the execution of the one or more manufacturing apparatuses 11 and the plurality of recipes are managed. Further, the values of the raw information shown in FIG. 8 are information prepared for the explanation, and are not actual measurement values.

Subsequently, the measurement information accumulation unit 1204 acquires a plurality of measurement information by performing a specific calculation on the plurality of the raw information shown in FIG. 8. Here, the specific calculation is a calculation of a mean value, and the measurement information accumulation unit 1204 calculates the mean value every minute. The measurement information accumulation unit 1204 accumulates the plurality of the measurement information in the measurement information storage unit 1201. FIG. 9 illustrates a measurement information management table for managing the measurement information accumulated in the measurement information accumulation unit 1204. The measurement information management table includes [manufacturing apparatus identifier], [recipe identifier], [recipe step identifier], [mean value (gas flow rate)] and [time information]. [Manufacturing apparatus identifier], [recipe identifier], [recipe step identifier], [mean value (gas flow rate)] and [time information] are the same as those provided in FIG. 8. Further, the mean value is calculated by the measurement information accumulation unit 1204.

Moreover, the condition information storage unit 1209 stores therein condition information [260<=gas flow rate<=280] for determining normality/fault of a gas flow rate within a furnace.

Under this circumstance, the user inputs necessary information on a screen shown in FIG. 10 from the client device 13 and presses a button of [chart output]. FIG. 10 is a screen for outputting the chart by inputting the chart output instruction. Here, the necessary information includes the information specifying the predetermined start point and the valid time information, for designating a time period for acquiring the measurement information. Here, for example, it is assumed that there are installed a field 101 for inputting the recipe step identifier, a field 102 for inputting the valid time and a field 103 for inputting the condition of the value of the gas flow rate in order to designate the measurement information condition. Further, if a value is not inputted in the field 103, a start time point of the recipe step designated by [recipe step identifier] inputted in the field 101 is set as a start point for acquiring the measurement information. In addition to this information, the information is appropriately designated from at least one of a data type (a kind of data of the measurement information such as the gas flow rate, the temperature, the pressure or the like), the manufacturing apparatus identifier and the recipe identifier. Typically, the data type is necessary. Further, on the screen in FIG. 10, it may be possible to input only the data type information. Moreover, on the screen of FIG. 10, it may be also possible to input only the data type and the manufacturing apparatus identifier or only the data type and the recipe identifier. In addition, if a check box 104 of [total chart] is checked, a total value of all the measurement information values ranging from the start time point of the recipe step indentified as the measurement information to a time point when the measurement information is acquired are outputted as a chart. FIG. 10 illustrates an input of a recipe step identifier [011] in the field 101, a valid time (minute) [20] in the field 102, a data type [gas flow rate], a manufacturing apparatus identifier [E1] and a recipe identifier [R1]. Therefore, if the user presses [chart output] button under this circumstance, the instruction input unit 1301 receives an output instruction for outputting the measurement information which satisfies the conditions of [target recipe step=001], [valid time=20 minutes], [manufacturing apparatus identifier=E1] and [recipe identifier=R1] among the measurement information (e.g., information provided in FIG. 8) of the [gas flow rate]. Further, an example of this output instruction may be, e.g., [chart output recipe step identifier="001", valid time="20", data type="gas flow rate", manufacturing apparatus identifier="E1", recipe identifier="R1"].

Subsequently, the instruction transmitting unit 1302 transmits the output instruction [chart output recipe step identifier="001", valid time="20", data type="gas flow rate", manufacturing apparatus identifier="E1", recipe identifier="R1"] to the server device 12.

Thereafter, the instruction receiving unit 1205 of the server device 12 receives the output instruction [chart output recipe step identifier="001", valid time="20", data type="gas flow rate", manufacturing apparatus identifier="E1", recipe identifier="R1"].

Then, the measurement information acquisition unit 1203 of the server device 12 searches for and acquires the measurement information coincident with the output instruction [chart output recipe step identifier="001", valid time "20", data type="gas flow rate", manufacturing apparatus identifier="E1", recipe identifier="R1"] from the measurement information stored in the measurement information storage unit 1201. To be specific, among the data having the manufacturing apparatus identifier [E1] and the recipe identifier [R1] of the measurement information of the gas flow rate managed by the measurement information management table of FIG. 9, the measurement information acquisition unit 1203 sets a start point to be [2005/12/02 15:00:00] which is a start time point of the recipe step identifier [001], and sets an end point to be [2005/12/02 15:00:00], which represents a time point when a valid time of 20 minutes elapses from the start point. Then, the measurement information is acquired in sequence from the measurement information containing [2005/12/02 15:00:00] which is the start point of the measurement information of the recipe step identifier [001]. Then, the acquisition of the measurement information is terminated at a time point of acquiring the measurement information of [2005/12/02 15:20:00] which is the end point. Through this process, all the measurement information included in the time period ranging from the start point to the end point is acquired. In addition, the measurement information acquisition unit 1203 acquires information shown in FIG. 11. Furthermore, the measurement information of the end point may or may not be acquired.

Subsequently, the fault detection unit 1210 of the server device 12 acquires the measurement information shown in FIG. 11 from the measurement information acquisition unit 1203, and reads the condition information [260<=gas flow rate<=280] from the condition information storage unit 1209, and detects a fault of the measurement information of FIG. 11 by using the condition information. For example, since all of [mean values] in the measurement information of FIG. 11 are less than 260, they are determined as fault values.

Thereafter, the output information composing unit 1206 composes a chart as output information by using the information in FIG. 11 acquired by the measurement information acquisition unit 1203 and the determination result of the fault detection unit 1210. The chart is a line graph in which a horizontal axis represents time indicating time information and a vertical axis represents a value (mean value of gas flow rates).

Afterwards, the output unit 1207 transmits the line graph composed by the output information composing unit 1206 to the client device 13.

Figure 12:
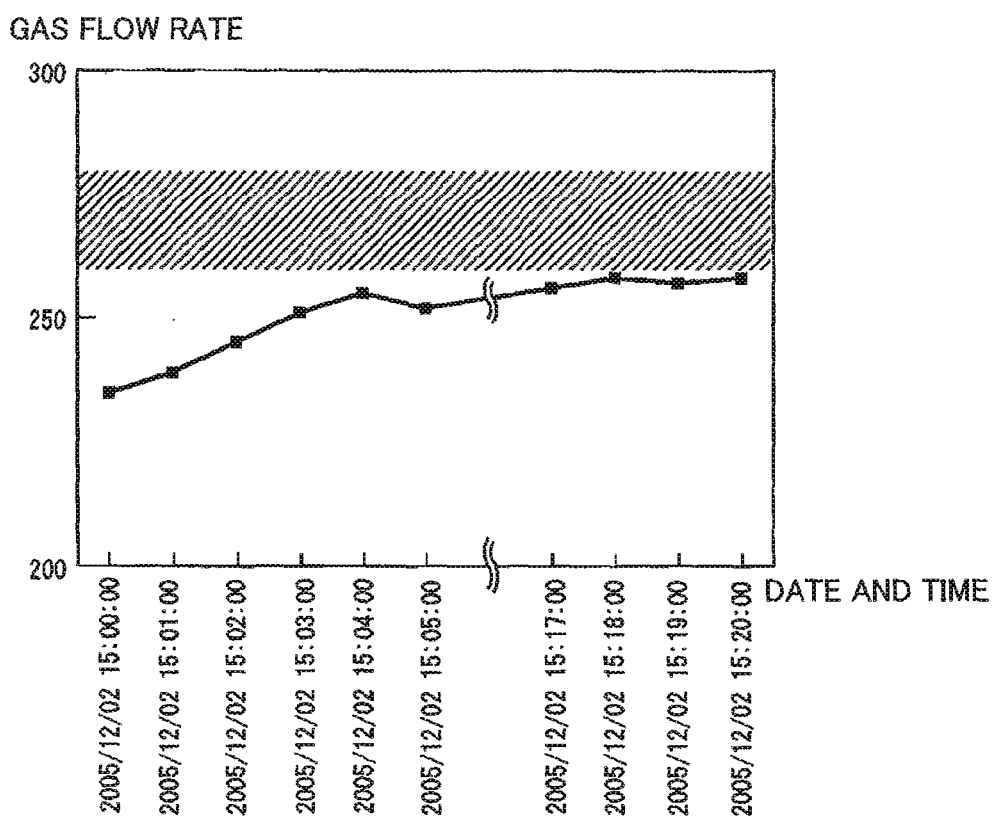
FIG. 12 is a display example in accordance with the embodiment of the present invention.

The receiving unit 1303 of the client device 13 receives the line graph, and the display unit 1304 displays the line graph on a display, as illustrated in FIG. 12. In FIG. 12, a normal range is marked by slanting lines.

Figure 13:
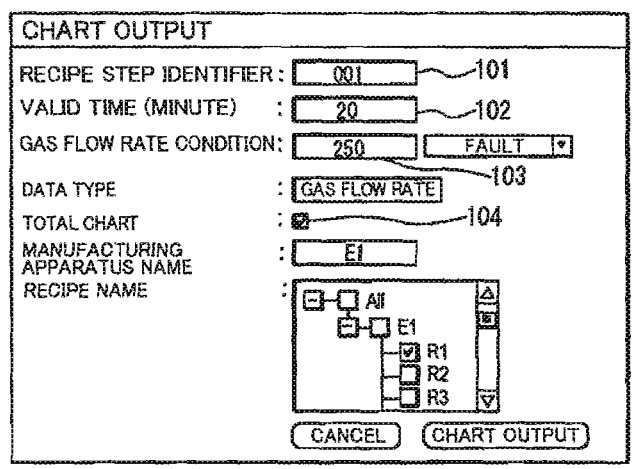
FIG. 13 shows a display example in accordance with the embodiment of the present invention.

Thereafter, as illustrated in FIG. 13, in the input example shown in FIG. 10, it is assumed that the gas flow rate condition is set to be [250] or more, and the check box 104 of [total chart] is checked. Under this circumstance, if the user presses [chart output] button, the instruction input unit 1301 receives the output instruction for outputting the measurement information satisfying the conditions of [target recipe step=001], [valid time=20 minutes], [gas flow rate condition=250], [chart output=total], [manufacturing apparatus identifier=E1] and [recipe identifier=R1] among the measurement information (e.g., information shown in FIG. 8) of [gas flow rate]. Further, an example of this output instruction may be, e.g., [chart output recipe step identifier="001", valid time="20", gas flow rate condtion="250", data type="gas flow rate", chart output="total", manufacturing apparatus identifier="E1", recipe identifier="R1"]. Besides, in case of checking the check box 104 of [total chart], here, it is assumed that the fault detection by the fault detection unit 1210 is not performed.

Subsequently, the instruction transmitting unit 1302 transmits this output instruction to the server device 12. Then, the instruction receiving unit 1205 of the server device 12 receives this output instruction.

Further, the measurement information acquisition unit 1203 of the server device 12 searches and acquires the measurement information satisfying the output instruction [chart output recipe step identifier="001", valid time="20", gas flow rate condition="250", data type="gas flow rate", chart output="total", manufacturing apparatus identifier="E1", recipe identifier="R1"] from the measurement information stored in the measurement information storage unit 1201. To be specific, among the data having the manufacturing apparatus identifier [E1] and the recipe identifier [R1] of the measurement information of the gas flow rate managed by the measurement information management table of FIG. 8, the first measurement information acquisition unit 12031 of the measurement information acquisition unit 1203 acquires the measurement information in sequence from [2005/12/02 15:00:00] which is the start time of the recipe step identifier [001]. Then, it determines whether or not [mean value] of the measurement information is equivalent to the gas flow rate condition of [250] or more. If so, the valid time measurement information acquisition unit 12032 performs the acquisition of the measurement information along a time axis by starting from that measurement information as the start point. Here, [mean value] of the measurement information which has [time information] of [2005/12/02 15:03:00] is [251], and since this value is greater than [250], the acquisition of the measurement information is started from this measurement information. However, since [chart output="total"] is included in the output instruction, the valid time measurement information acquisition unit 12032 calculates a total value of [mean value] from the start time point of the recipe step of the recipe step identifier [001], and acquires the calculated total value as a value of the measurement information. In addition, the acquisition of the measurement information is terminated if there occurs any one of a case in which the acquired measurement information becomes less than the gas flow rate condition of [250]; a case in which the information in the recipe step of the recipe step identifier [001] does not exist; and a case in which the measurement information corresponds to time [2005/12/02 15:23:00] which is a time when the valid time [20 minutes] has elapsed from [time information] of [2005/12/02 15:03:00] of the measurement information from which the acquisition has started. Here, if the gas flow rate does not become smaller than [250] during a time period ranging from the time [2005/12/02 15:03:00] to the time [2005/12/02 15:23:00], the measurement information until the time [2005/12/02 15:23:00], which is the end time point of the valid time, is acquired. Further, the measurement information acquisition unit 1203 acquires the information of FIG. 14. Furthermore, the measurement information of the end point may or may not be acquired. If so, the valid time measurement information acquisition unit 12032 performs the acquisition of the measurement information along a time axis by starting from that measurement information as the start point. Here, [mean value] of the measurement information which has [time information] of [2005/12/02 15:03:00] is [251], and since this value is greater than [250], the acquisition of the measurement information is started from this measurement information. However, since [chart output="total"] is included in the output instruction, the valid time measurement information acquisition unit 12032 calculates a total value of [mean value] from the start time point of the recipe step of the recipe step identifier [001], and acquires the calculated total value as a value of the measurement information. In addition, the acquisition of the measurement information is terminated if there occurs any one of a case in which the acquired measurement information becomes less than the gas flow rate condition of [250]; a case in which the information in the recipe step of the recipe step identifier [001] does not exist; and a case in which the measurement information corresponds to time 2005/12/02 15:23:00 which is a time when the valid time [20 minutes] has elapsed from [time information] of [2005/12/02 15:03:00] of the measurement information from which the acquisition has started. Here, if the gas flow rate does not become smaller than [250] during a time period ranging from the time [2005/12/02 15:03:00] to the time [2005/12/02 15:03:00], the measurement information until the time [2005/12/02 15:23:00], which is the end time point of the valid time, is acquired. Further, the measurement information acquisition unit 1203 acquires the information of FIG. 14. Furthermore, the measurement information of the end point may or may not be acquired.

Thereafter, the output information composing unit 1200 composes a chart as output information by using the information in FIG. 14 acquired by the measurement information acquisition unit 1203. The chart is a line graph in which a horizontal axis represents time indicating time information and a vertical axis represents a value (mean value of gas flow rates).

Afterwards, the output unit 1207 transmits the line graph composed by the output information composing unit 1206 to the client device 13.

Figure 15:
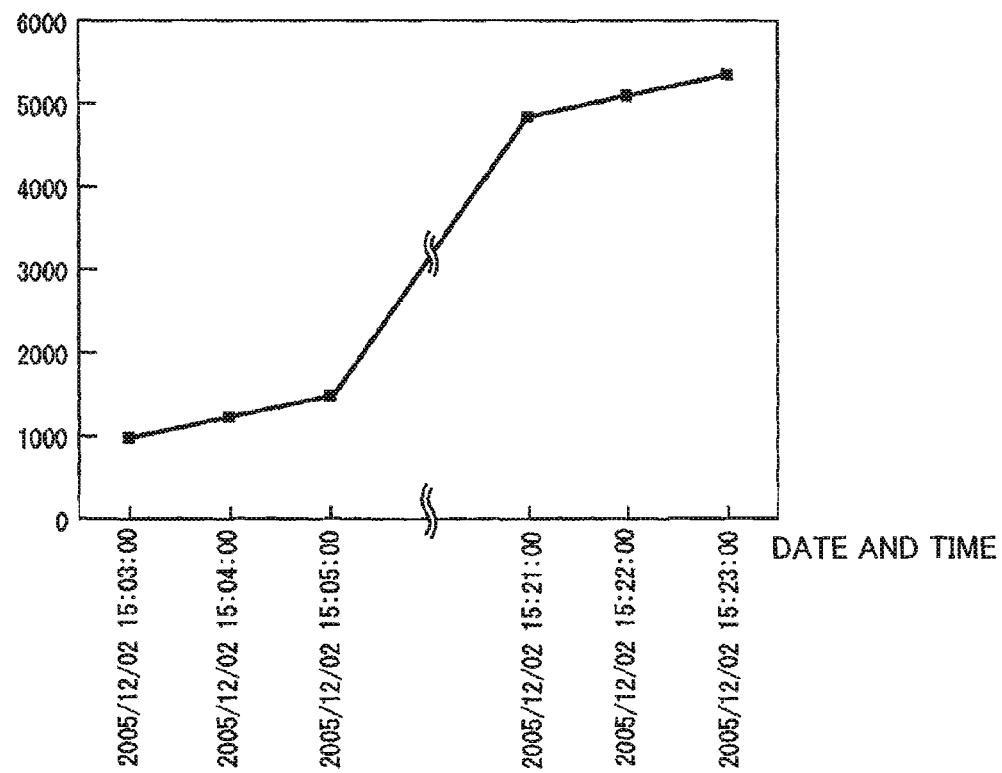
FIG. 15 provides a display example in accordance with the embodiment of the present invention.

The receiving unit 1303 of the client device 13 receives the line graph, and the display unit 1304 displays the line graph on a display as illustrated in FIG. 15.

As described above, in accordance with the present embodiment, it is possible to output the measurement information ranging from the predetermined start point to a time point indicated by the valid time, which is designated by the output information including the information specifying the predetermined start point and information of the valid time during which the measurement information is acquired, so that it is possible to specify a monitoring time for the measurement information in detail. Accordingly, it is possible to instantaneously show only the necessary information, so that the monitoring which includes the fault detection of the manufacturing apparatuses or the like can be performed efficiently. Further, to be more specific, since the monitoring time can be subdivided to have a smaller time period in the recipe step, the convenience thereof is enhanced. Furthermore, since the unnecessary information is prevented from being outputted, there is no likelihood of monitoring the measurement information in a different time period by a mistake. As a result, a highly accurate fault detection is enabled.

Figure 16:
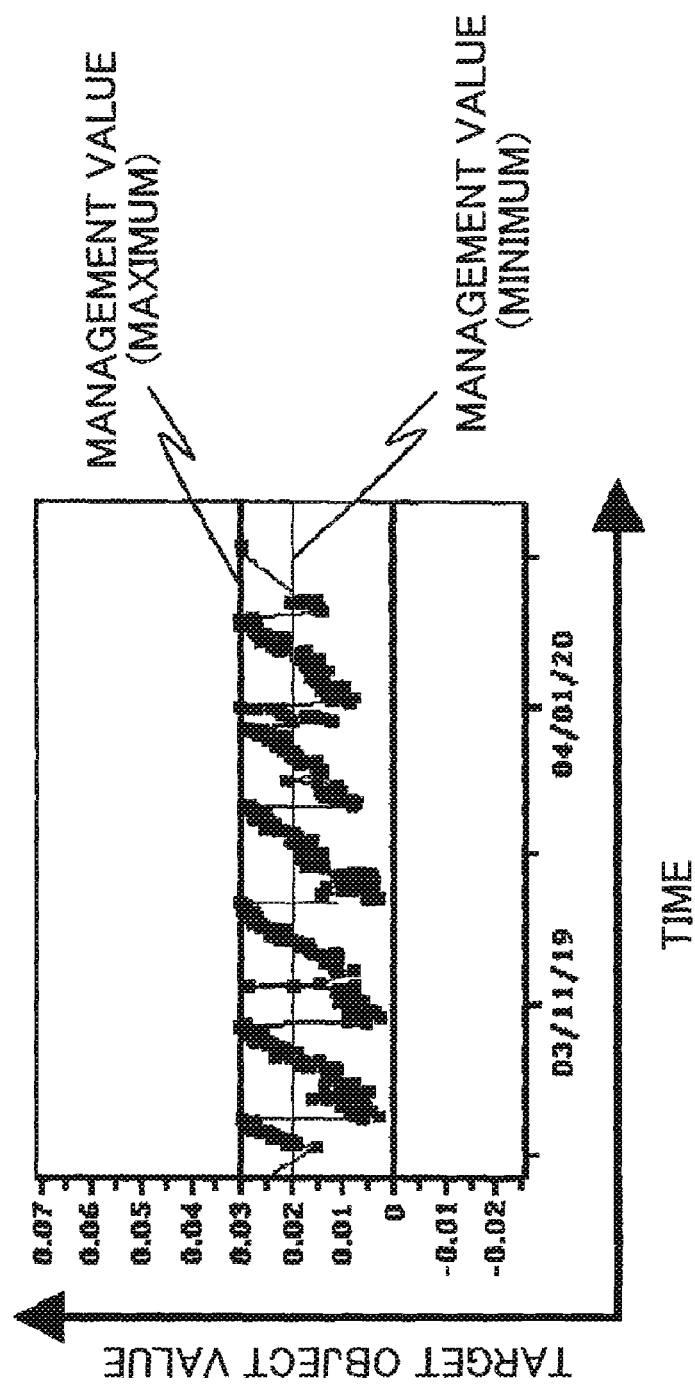
FIG. 16 is a display example in accordance with the embodiment of the present invention.

In addition, in the present embodiment, the outputted chart may be an SPC chart, as illustrated in FIG. 16, visually distinguishing the measurement information of the different manufacturing apparatus identifiers or the different recipe identifiers or both of them among a plurality of measurement information read from the measurement information storage unit 1201 to be coincident with an output instruction which is an instruction for outputting an SPC chart, and plotting the read plurality of measurement information according to a time sequence indicated by time information included in any one kind of measurement information. Further, the SPC chart shown in FIG. 16 is a chart including, for example, measurement information of a single manufacturing apparatus identifier. Further, on the SPC chart shown in FIG. 16, a management value (maximum) and a management value (minimum) are outputted. When a certain measurement value is out of the range of these management values, it indicates that there is a fault. The management value (maximum) and the management value (minimum) are previously retained in the condition information storage unit 1209. Furthermore, the measurement information used in FIG. 16 is measurement information prepared for the explanation, and it is different from the measurement information explained in the present embodiment.

Figure 17:
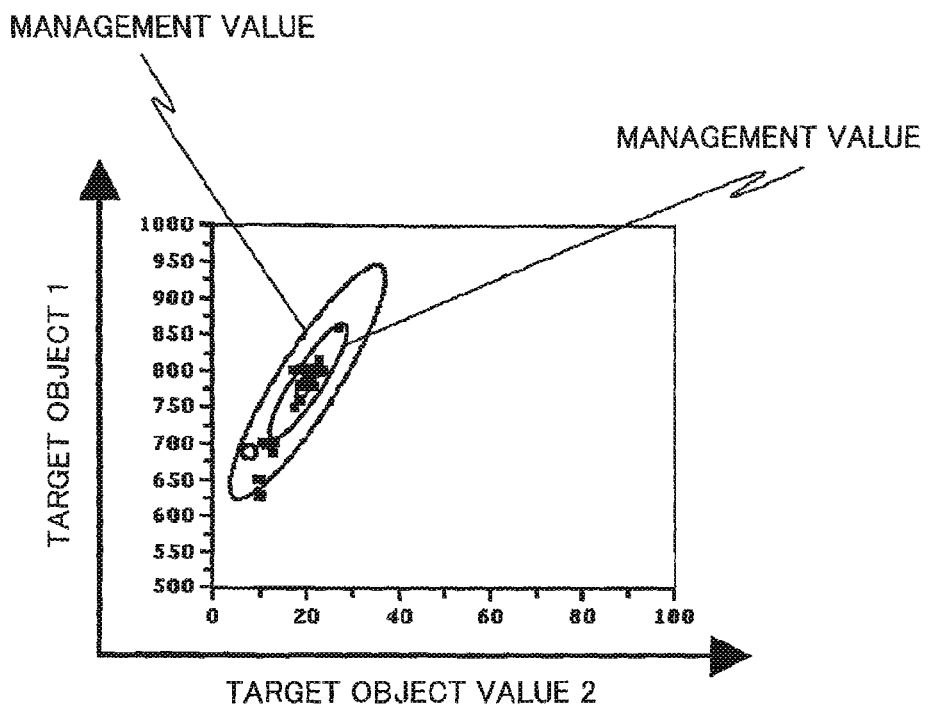
FIG. 17 offers a display example in accordance with the embodiment of the present invention.

Moreover, in the present embodiment, the outputted chart may be a correlation chart, as shown in FIG. 17, visually distinguishing the measurement information of the different manufacturing apparatus identifiers or the different recipe identifiers or both of them among a plurality of measurement information read from the measurement information storage unit 1201 to be coincident with an output instruction which is an instruction for outputting a correlation chart, and showing a correlation between two kinds of measurement information (for example, the temperature and the pressure, and the like) Further, the correlation chart shown in FIG. 17 is a chart including, for example, two kinds of measurement information of a single apparatus identifier. Further, on the correlation chart shown in FIG. 17, two management values are outputted. When a certain measurement value is out of the range of the two management values, it indicates that there is a fault. Furthermore, the measurement information used in FIG. 17 is measurement information prepared for the explanation, and it is different from the measurement information explained in the present embodiment.

Figure 18:
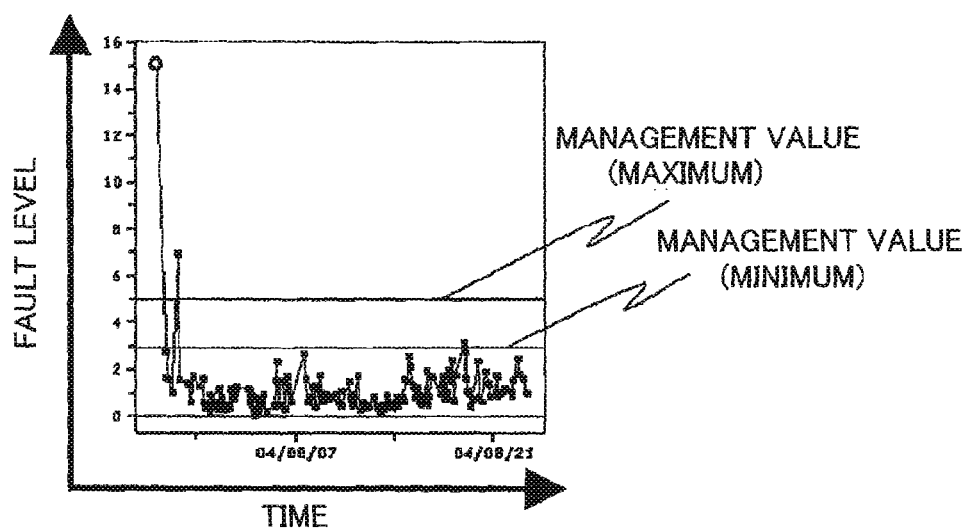
FIG. 18 is a display example in accordance with the embodiment of the present invention.

In addition, in the present embodiment, the outputted chart may be an MD chart, as illustrated in FIG. 18, visually distinguishing the measurement information of the different manufacturing apparatus identifiers or the different recipe identifiers or both of them among a plurality of measurement information, which is read from the measurement information storage unit 1201 and includes any one of the one or more manufacturing apparatus identifiers or any one of the one or more recipe identifiers, or any one of the one or more manufacturing apparatus identifiers and any one of the one or more recipe identifiers contained in an output instruction which is an instruction for outputting an MD (Mahalanobis Distance) chart, and showing a correlation between three or more kinds of measurement information (for example, the gas flow rate, the pressure and the temperature at two locations). Further, the MD chart shown in FIG. 18, may be a chart including, for example, measurement information of a single manufacturing apparatus identifier. Furthermore, the MD chart shown in FIG. 18 is a chart in which a fault determination is carried out by using a Mahalanobis distance. To be more specific, the MD chart illustrated in FIG. 18 is a chart modeling data in a normal state and shows a degree of fault as a numerical value by using the Mahalanobis distance. Further, on the MD chart shown in FIG. 18, two management values are outputted. When a certain measurement value is out of the range of the two management values, it indicates that there is a fault. Furthermore, the measurement information used in FIG. 18 is measurement information prepared for the explanation, and it is different from the measurement information explained in the present embodiment.

Figure 19:
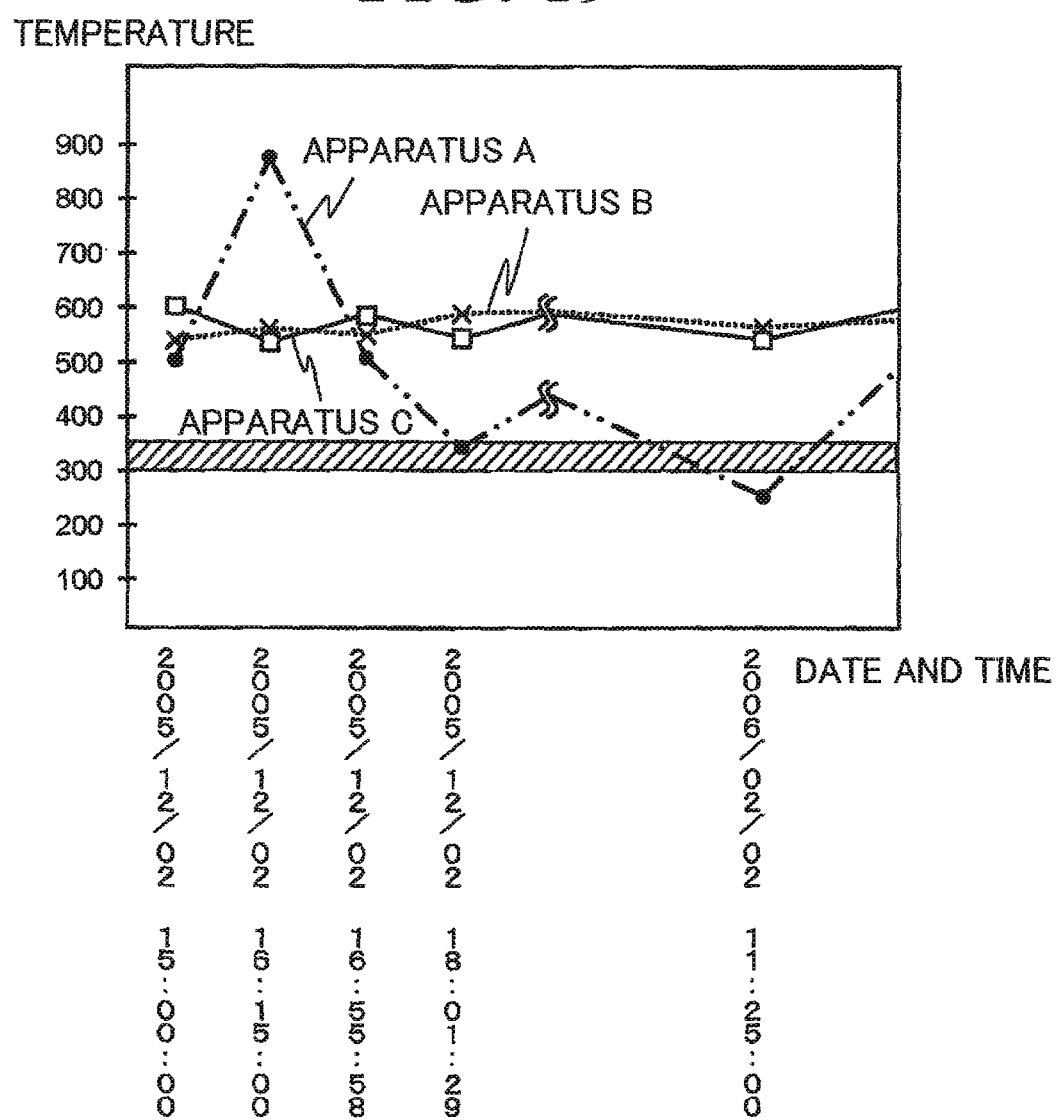
FIG. 19 shows a display example in accordance with the embodiment of the present invention.

Further, in the example of the present embodiment, the outputted chart is the single line graph showing the measurement information of the one manufacturing apparatus identifier or the one recipe identifier and connecting the read plurality of measurement information according to the time sequence indicated by the time information contained in any one kind of measurement information. However, the outputted chart may be, as shown in FIG. 19, three individual charts visually distinguishing the measurement information of different manufacturing apparatus identifiers among a plurality of measurement information read from the measurement information storage unit 1201 and having three manufacturing apparatus identifiers contained in an output instruction, and plotting the read plurality of measurement information according to a time sequence indicated by time information contained in any one kind of measurement information. In this case, the output instruction includes three apparatus identifiers, for example, ⌈apparatus A⌋, ⌈apparatus B⌋ and ⌈apparatus C⌋. The measurement information acquisition unit 1203 acquires measurement information three times by searching the measurement information storage unit 1201 three times by means of using each of ⌈apparatus A⌋, ⌈apparatus B⌋ and ⌈apparatus C⌋ as a key, and the output information composing unit 1206 composes, for each key, a chart having different property values of dots or lines, thus obtaining the three charts. Then, the three charts are outputted. Furthermore, the measurement information used in FIG. 19 is measurement information prepared for the explanation, and it is different from the measurement information explained in the present embodiment.

In the present embodiment, since the display type of the three or more charts (the SPC chart, the correlation chart, the MD chart, and the like) can be freely selected as described above, an analysis of the monitoring result or a monitoring in various aspects is enabled.

Moreover, in the example of the present embodiment, it may be possible that the raw information or the measurement information is previously retained in the server device 12. In such case, the raw information or the measurement information is acquired from the manufacturing apparatuses 11 by a non-illustrated means and transmitted to the server device 12 via a storage medium or the like.

Furthermore, in the present embodiment, it may be desirable that the user inputs an instruction for enlarging a portion of a chart under observation and changes a scale of a part of the chart (changes a time interval of measurement information or an interval of steps), and then outputs the chart.

Further, in the present embodiment, it may be possible that the measurement information has the same constitution as the raw information. In such case, the measurement information accumulation unit becomes unnecessary.

Furthermore, in the present embodiment, a transcription of the raw information between the manufacturing apparatuses and the server device is not essential. The raw information can be sent to the server device from the manufacturing apparatuses via, for example, a storage medium.

In addition, in the present embodiment, the group management system may not have the client device 13. In such case, the user may input an instruction such as an output instruction and the like on the server device 12.

Further, in the example of the present embodiment though the charts are outputted by designating the manufacturing apparatus identifier or the recipe identifier, it may be also possible to output a chart by designating one or more manufacturing apparatus identifiers and one or more recipe identifiers. In case that the user inputs an output instruction including the one or more manufacturing apparatus identifiers and the one or more recipe identifiers, the fault detection unit 1210 searches for measurement information (or raw information) by using each of the designated one or more manufacturing apparatus identifiers and one or more recipe identifiers as a key and detects a fault therefrom, and the output information composing unit 1206 composes a chart.

Besides, in the present embodiment, in case that the manufacturing apparatus is configured to transmit the raw information in sequence to the server device 12 whenever the raw information is acquired, it may be very desirable to perform on a real-time basis a fault detection process or an acquisition of the measurement information ranging from the predetermined start point to the time point indicated by the valid time information by being triggered upon receiving the output instruction by the instruction receiving unit of the server device and to update the output information (chart and the like) whenever the raw information is received because the user can be informed of a fault as soon as the fault occurs. Further, such real-time fault detection can be carried out as follows. That is, the fault detection unit immediately determines whether the measurement information, which ranges from the predetermined start point to the time point indicated by the valid time information and continuously acquired by the measurement information acquisition unit, satisfies the condition information, and the output information composing unit continuously composes the output information according to a determination result of the fault detection unit, and the output unit outputs the output information composed by the output information composing unit, while updating it.

Further, the process in accordance with the present embodiment can be realized by software. Moreover, this software can be distributed in a way of software download or the like. Further, it is possible to record this software in a storage medium such as a CD-ROM and distribute it. Moreover, the software for executing the server device in the present embodiment is a program as follows. That is, the program stores time sequential information of a plurality of measurement information which is stored in the measurement information storage unit, obtained by one or more manufacturing apparatuses for performing a preset process on a target substrate and includes the information specifying the predetermined start point and information of the valid time during which the measurement information is acquired, wherein the program executes on a computer: an instruction receiving step for receiving an output instruction of the measurement information including the values obtained when the preset process is performed by the manufacturing apparatuses and the time information indicating time; a measurement information acquiring step for acquiring, from the measurement information storage unit, measurement information ranging from the predetermined start point to a time point indicated by the valid time information; an output information composing step for composing the output information by using the acquired measurement information; and an outputting step for outputting the output information composed in the output information composing step.

Further, in the program, a chart as the output information is composed by using the acquired measurement information in the output information composing step, and the chart composed by the output information composing unit outputted in the outputting step.

Still further, in the program, the predetermined start point is a start time point of a specific recipe step contained in a recipe; the measurement information has a recipe step identifier for identifying the recipe step; the output instruction includes the recipe step identifier and the valid time information; and the measurement information acquiring step is a step for acquiring measurement information, which corresponds to the recipe step identifier contained in the output instruction and ranges from the start time point of the recipe step identified by the recipe step identifier to a time point indicated by the valid time information.

Moreover, in the program, acquired in the measurement information acquiring step is the measurement information until an end time point of the valid time or an end time point of the recipe step identified by the recipe step identifier, whichever is earlier.

Furthermore, in the program, the predetermined start point is a time point satisfying a measurement information condition; the output instruction includes the condition related to the measurement information and the valid time information; and the measurement information acquiring step includes a first measurement information acquiring step for acquiring measurement information which initially satisfies the condition related to the measurement information and a valid time measurement information acquiring step for acquiring measurement information within the valid time starting from a time point when the first measurement information acquisition unit acquires initial measurement information.

In addition, in the program, acquired in the measurement information acquiring step is the measurement information until the end time point of the valid time or a time point from which the measurement information acquired by the valid time measurement information acquisition unit does not satisfy the measurement information condition anymore, whichever is earlier.

Further, in the program, the predetermined start point is a time point satisfying the measurement information condition in a specific recipe step contained in a recipe; the measurement information has a recipe step identifier for identifying the recipe step; the output instruction includes the recipe step identifier, the condition related to measurement information and the valid time information; and the measurement information acquiring step includes: a first measurement information acquiring step for acquiring measurement information, which corresponds to the recipe step identifier contained in the output instruction and initially satisfies the condition related to the measurement information; and a valid time measurement information acquiring step for acquiring the measurement information ranging from a time point when the first measurement information acquisition unit acquires initial measurement information to a time point indicated by the valid time information.

Furthermore, in the program, acquired in the valid time measurement information acquiring step is the measurement information until the end time point of the valid time, the end time point of the recipe step identified by the recipe step identifier, or a time point from which the acquired measurement information does not satisfy the condition of the measurement value anymore, whichever is the earliest.

Further, in an information transmitting step or an information receiving step, a process executed by hardware, for example, a process executed by a modem, an interface card or the like (a process executed only by hardware) during the transmitting step is not included in the above-mentioned program.

Further, one or more computers can be used to execute the program. That is, centralized processing or distributed processing can be performed.

In addition, in accordance with each embodiment, it is possible to perform each process (each function) through centralized processing by a single apparatus (system), or through distributed processing by a plurality of apparatuses.

Further, in each embodiment, two or more communication means (the raw information receiving unit, the output unit, or the like) in a single apparatus can be implemented physically by a single means.

The present invention is not limited to the above-mentioned embodiments and can be modified in various ways, and it shall be understood that all the modifications are included in the scope of the present invention.

INDUSTRIAL APPLICABILITY

As stated above, the server device or the like in accordance with the present invention is suitable as a server device in a group management system including one or more manufacturing apparatuses for performing a preset process on a target substrate and the server device connected to the one or more manufacturing apparatuses and in particular, it is advantageous as a server device for acquiring and outputting measurement information and the like acquired in a recipe step.

What is claimed is:

1. A server device constituting a group management system, which includes one or more manufacturing apparatuses for performing a preset process on a target substrate and the server device connected with the one or more manufacturing apparatuses and has a function of performing a fault detection, the server device comprising:
   a measurement information storage unit for storing therein more than one measurement information, which is time sequential information measured in the one or more manufacturing apparatuses and has a measurement value obtained by performing a predetermined process by the manufacturing apparatuses and time information indicating time;
   an instruction receiving unit for receiving an output instruction of the measurement information, which contains information specifying a predetermined start point and information on a valid time during which the measurement information is acquired;
   a measurement information acquisition unit for acquiring, from the measurement information storage unit, measurement information ranging from the predetermined start point to a time point indicated by the valid time information;
   an output information composing unit for composing output information by using the acquired measurement information; and
   an output unit for outputting the output information composed by the output information composing unit.

2. The server device of claim 1, wherein the output information composing unit composes a chart as the output information by using the acquired measurement information; and
   the output unit outputs the chart composed by the output information composing unit.

3. The server device of claim 1, wherein the predetermined start point is a start time point of a specific recipe step contained in a recipe,
   the measurement information has a recipe step identifier for identifying the recipe step,
   the output instruction includes the recipe step identifier and the valid time information, and
   the measurement information acquisition unit acquires measurement information which corresponds to the recipe step identifier contained in the output instruction and ranges from the start time point of the recipe step identified by the recipe step identifier to a time point indicated by the valid time information.

4. The server device of claim 3, wherein the measurement information acquisition unit acquires measurement information until an end time point of the valid time or an end time point of the recipe step identified by the recipe step identifier, whichever is earlier.

5. The server device of claim 1, wherein the predetermined start point is a time point satisfying a condition related to the measurement information,
   the output instruction includes the condition related to the measurement information and the valid time information, and the measurement information acquisition unit includes:
a first measurement information acquisition unit for acquiring measurement information which initially satisfies the condition related to the measurement information; and
a valid time measurement information acquisition unit for acquiring measurement information for the valid time after the first measurement information acquisition unit acquires initial measurement information.

6. The server device of claim 5, wherein the measurement information acquisition unit acquires measurement information until an end time point of the valid time or a time point from which the measurement information acquired by the valid time measurement information acquisition unit does not satisfy the condition related to the measurement information anymore, whichever is earlier.

7. The server device of claim 1, wherein the predetermined start point is a time point satisfying a condition related to the measurement information in a specific recipe step contained in a recipe,
the measurement information has a recipe step identifier for identifying the recipe step,
the output instruction includes the recipe step identifier, the condition related to the measurement information and the valid time information, and
the measurement information acquisition unit includes:
a first measurement information acquisition unit for acquiring measurement information, which corresponds to the recipe step identifier contained in the output instruction and initially satisfies the condition related to the measurement information; and
a valid time measurement information acquisition unit for acquiring measurement information ranging from a time point when the first measurement information acquisition unit acquires initial measurement information to a time point indicated by the valid time information.

8. The server device of claim 7, wherein the valid time measurement information acquisition unit acquires measurement information until an end time point of the valid time, an end time point of the recipe step identified by the recipe step identifier, or a time point from which the acquired measurement information does not satisfy the condition of the measurement value anymore, whichever is the earliest.

9. The server device of claim 1, wherein the output information composing unit performs a specific calculation by using the acquired measurement information, and composes the output information by using a result of the specific calculation.

10. The server device of claim 1, further comprising:
a condition information storage unit for storing therein condition information indicating a condition for determining whether the measurement information has a fault; and
a fault detection unit for determining whether the measurement information acquired by the measurement information acquisition unit satisfies the condition information stored in the condition information storage unit,
wherein the output information composing unit composes the output information by using a determination result of the fault detection unit.

11. The server device of claim 1, wherein the output information composing unit composes an SPC chart which is a chart plotting the acquired measurement information according to a time sequence indicated by the time information contained in the measurement information, and
the output unit outputs the SPC chart composed by the output information composing unit.

12. The server device of claim 1, wherein the output information composing unit composes a correlation chart which is a chart showing a correlation between two kinds of measurement information from the acquired measurement information, and
the output unit outputs the correlation chart composed by the output information composing unit.

13. The server device of claim 1, wherein the output information composing unit composes a MD (Mahalanobis Distance) chart which is a chart showing a correlation among three or more kinds of measurement information from the acquired measurement information, and
the output unit outputs the MD chart composed by the output information composing unit.

14. A computer program product stored on a non-transitory computer readable medium comprises:
an instruction receiving step for receiving an output instruction of more than one measurement information, which is stored in a measurement information storage unit and contains information specifying a predetermined start point and information on a valid time during which the measurement information is acquired, and is time sequential information measured in one or more manufacturing apparatuses for performing a predetermined process on a target substrate and has a measurement value obtained by performing the predetermined process by the manufacturing apparatuses and time information indicating time;
a measurement information acquiring step for acquiring, from the measurement information storage unit, measurement information ranging from the predetermined start point to a time point indicated by the valid time information;
an output information composing step for composing output information by using the acquired measurement information; and
an outputting step for outputting the output information composed in the output information composing step.

15. The program of claim 14, wherein, in the output information composing step, a chart as the output information is composed by using the acquired measurement information; and
in the outputting step, the chart composed by the output information composing step is outputted.

16. The program of claim 14, wherein the predetermined start point is a start time point of a specific recipe step contained in a recipe,
the measurement information has a recipe step identifier for identifying the recipe step,
the output instruction includes the recipe step identifier and the valid time information, and
in the measurement information acquiring step, acquired is measurement information, which corresponds to the recipe step identifier contained in the output instruction and ranges from the start time point of the recipe step identified by the recipe step identifier to a time point indicated by the valid time information.

17. The program of claim 16, wherein, in the measurement information acquiring step, acquired is measurement information until an end time point of the valid time or an end time point of the recipe step identified by the recipe step identifier, whichever is earlier.

18. The program of claim 14, wherein the predetermined start point is a time point satisfying a condition related to the measurement information, the output instruction includes the condition related to the measurement information and the valid time information, and the measurement information acquiring step includes:

a first measurement information acquiring step for acquiring measurement information which initially satisfies the condition related to the measurement information; and a valid time measurement information acquiring step for acquiring measurement information for the valid time after the first measurement information acquisition step acquires initial measurement information.

19. The program of claim 18, wherein, in the measurement information acquiring step, acquired is measurement information until an end time point of the valid time or a time point from which the measurement information acquired by a valid time measurement information acquisition step does not satisfy the condition related to the measurement information anymore, whichever is earlier.

20. The program of claim 14, wherein the predetermined start point is a time point satisfying a condition related to the measurement information in a specific recipe step contained in a recipe, the measurement information has a recipe step identifier for identifying the recipe step, the output instruction includes the recipe step identifier, the condition related to the measurement information and the valid time information, and the measurement information acquiring step includes:

a first measurement information acquiring step for acquiring measurement information, which corresponds to the recipe step identifier contained in the output instruction and initially satisfies the condition related to the measurement information; and a valid time measurement information acquiring step for acquiring measurement information ranging from a time point when the first measurement information acquisition step acquires initial measurement information to a time point indicated by the valid time information.

21. The program of claim 20, wherein, in the valid time measurement information acquiring step, acquired is measurement information until an end time point of the valid time, an end time point of the recipe step identified by the recipe step identifier, or a time point from which the acquired measurement information does not satisfy a condition of the measurement value anymore, whichever is the earliest.

* * * * *

UNITED STATES PATENT AND TRADEMARK OFFICE
CERTIFICATE OF CORRECTION

PATENT NO.         : 8,055,391 B2
APPLICATION NO.    : 12/375693
DATED              : November 8, 2011
INVENTOR(S)        : Masashi Takahashi et al.

It is certified that error appears in the above-identified patent and that said Letters Patent is hereby corrected as shown below:

In the Specification, column 24, line 53, replace "1112" with --1102 --

In the Specification, column 26, line 36, replace "011" with -- 001 --

In the Specification, column 27, line 8, replace "15:00:00" with -- 15:20:00 --

In the Specification, column 29, line 11, replace "15:03:00" with -- 15:23:00 --

In the Specification, column 29, line 18, replace "1200" with -- 1206 --

Signed and Sealed this
Sixth Day of March, 2012

David J. Kappos
*Director of the United States Patent and Trademark Office*